(12) United States Patent
Shioga et al.

(10) Patent No.: US 7,405,366 B2
(45) Date of Patent: Jul. 29, 2008

(54) INTERPOSER AND ELECTRONIC DEVICE FABRICATION METHOD

(75) Inventors: Takeshi Shioga, Kawasaki (JP);
Yoshikatsu Ishizuki, Kawasaki (JP);
John David Baniecki, Kawasaki (JP);
Kazuaki Kurihara, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 59 days.

(21) Appl. No.: 11/339,661

(22) Filed: Jan. 26, 2006

(65) Prior Publication Data

US 2007/0076348 A1 Apr. 5, 2007

(30) Foreign Application Priority Data

Sep. 30, 2005 (JP) ............................. 2005-287065

(51) Int. Cl.
*H05K 1/16* (2006.01)

(52) U.S. Cl. .................... 174/260; 174/262; 361/760

(58) Field of Classification Search ................ 174/260, 174/262; 361/760, 792, 793, 794, 795
See application file for complete search history.

(56) References Cited

U.S. PATENT DOCUMENTS

| 5,455,064 | A | 10/1995 | Chou et al. |
| 6,178,082 | B1 | 1/2001 | Farooq et al. |
| 6,764,931 | B2 * | 7/2004 | Iijima et al. .................. 438/584 |
| 6,998,308 | B2 * | 2/2006 | Ooi et al. ..................... 438/253 |
| 2004/0231885 | A1 * | 11/2004 | Borland et al. .............. 174/260 |

FOREIGN PATENT DOCUMENTS

| JP | 4-211191 | 8/1992 |
| JP | 7-176453 | 7/1995 |
| JP | 3014383 | 12/1999 |
| JP | 2001-35990 | 2/2001 |
| JP | 2001-68583 | 3/2001 |
| JP | 2002-83892 | 3/2002 |
| JP | 2003-158239 | 5/2003 |
| JP | 2003-282827 | 10/2003 |

* cited by examiner

*Primary Examiner*—Ishwar (I. B.) Patel
(74) *Attorney, Agent, or Firm*—Kratz, Quintos & Hanson, LLP

(57) ABSTRACT

An interposer 2 including a base 10 formed of a plurality of resin layers 26, 34, 42, 52, 56; a thin-film capacitor 12 buried in the base 10, including a lower electrode 20, a capacitor dielectric film 22 and an upper electrode 24; a first through-electrode 14b formed through the base 10 and electrically connected to the upper electrode 24 of the thin-film capacitor 12; and a second through-electrode 14a formed through the base 10 and electrically connected to the lower electrode 20 of the thin-film capacitor 12, further including: an interconnection 48 buried in the base 10 and electrically connected to the respective upper electrodes 24 of a plurality of the thin-film capacitors 12, a plurality of the first through-electrodes 14b being electrically connected to the upper electrodes 24 of said plurality of the thin-film capacitors 12 via the interconnection 48, and said plurality of the first through-electrodes 14b being electrically interconnected by the interconnections 48.

11 Claims, 18 Drawing Sheets

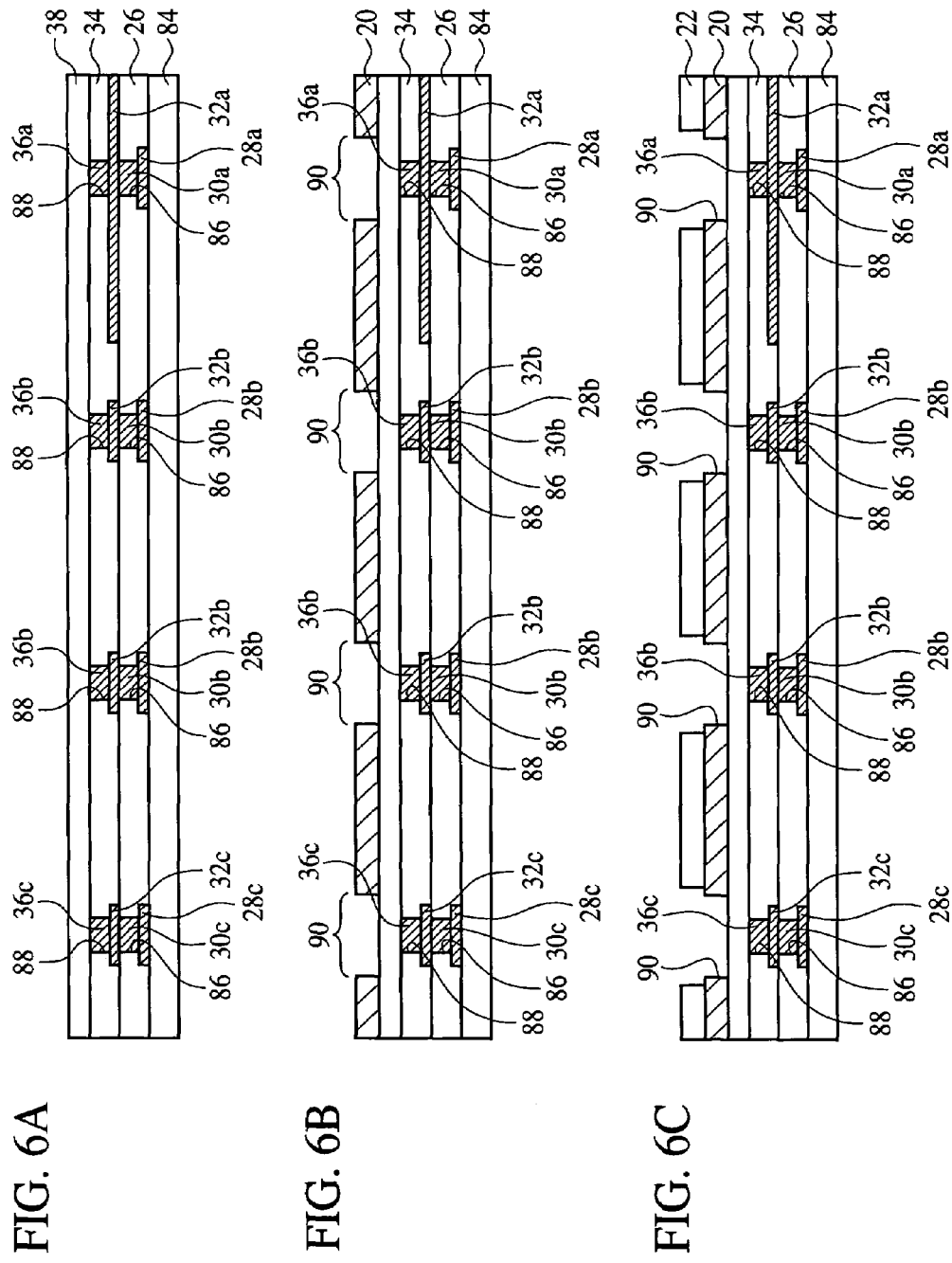

INTERPOSER AND ELECTRONIC DEVICE FABRICATION METHOD

CROSS-REFERENCE TO RELATED APPLICATION

This application is based upon and claims priority of Japanese Patent Application No. 2005-287065, filed on Sep. 30, 2005, the contents being incorporated herein by reference.

BACKGROUND OF THE INVENTION

The present invention relates to an interposer, and an electronic device fabrication method using the interposer, more specifically, an interposer which can simplify test steps, and an electronic device fabrication method using the interposer.

Recently, in digital LSIs (Large Scale Integrated circuits), etc., typically microprocessors, the operation speed increase and the power consumption decrease have been made.

To stably operate an LSI in a GHz band-radio-frequency region and at low voltage, it is very important to suppress the source voltage variation due to abrupt changes of the load impedance, etc. of the LSI and to remove radio-frequency noises of the power source.

Conventionally, the source voltage change is suppressed, and the radio-frequency noises are removed by mounting decoupling capacitors near an LSI, etc. mounted on a circuit board. The decoupling capacitors are formed on a substrate discrete from the circuit board and are mounted suitably on the circuit board.

However, when decoupling capacitors are mounted near an LSI mounted on a circuit board, the LSI and the decoupling capacitors are electrically connected to the decoupling capacitors via interconnection formed in the circuit board, and large inductance due to the wiring is present. Due to the large inductance between the LSI and the decoupling capacitors, the source voltage variation cannot be sufficiently suppressed, and the radio-frequency noises cannot be sufficiently removed. To make the suppression of the source voltage variation and the removal of the radio-frequency noises sufficient, the equivalent series resistance (ESR) and the equivalent series inductance (ESL) are required to be decreased.

Here, the technique of disposing between the LSI and the circuit board an interposer with capacitor incorporated in is noted (Patent References 1 to 5).

Following references disclose the background art of the present invention.

[Patent Reference 1]
  Specification of Japanese Patent Application Unexamined Publication No. Hei 4-211191

[Patent Reference 2]
  Specification of Japanese Patent Application Unexamined Publication No. Hei 7-176453

[Patent Reference 3]
  Specification of Japanese Patent Application Unexamined Publication No. 2001-68583

[Patent Reference 4]
  Specification of Japanese Patent Application Unexamined Publication No. 2001-35990

[Patent Reference 5]
  Specification of Japanese Patent Application Unexamined Publication No. 2002-83892

[Patent Reference 6]
  Specification of Japanese Patent Application Unexamined Publication No. 2003-158239

[Patent Reference 7]
  Specification of Japanese Patent No. 3014383

[Patent Reference 8]
  Specification of Japanese Patent Application Unexamined Publication No. 2003-282827

However, in testing the characteristics of the thin-film capacitors of the proposed interposer, a probe is connected sequentially to the respective through-electrodes connected to the thin-film capacitors for the test. Accordingly, it is difficult to test the proposed interposer in a short period of time and at low costs.

SUMMARY OF THE INVENTION

An object of the present invention is to provide an interposer which allows the test steps to be simplified, and an electronic device fabrication method using the interposer.

According to one aspect of the present invention, there is provided an interposer comprising a base formed of a plurality of resin layers; a thin-film capacitor buried in the base, including a lower electrode, a capacitor dielectric film formed on the lower electrode, and an upper electrode formed on the capacitor dielectric film; a first through-electrode formed through the base and electrically connected to the upper electrode of the thin-film capacitor; and a second through-electrode formed through the base and electrically connected to the lower electrode of the thin-film capacitor, further comprising: an interconnection buried in the base and electrically connected to the respective upper electrodes of a plurality of the thin-film capacitors, a plurality of the first through-electrodes being electrically connected to the upper electrodes of said plurality of the thin-film capacitors via the interconnection, and said plurality of the first through-electrodes being electrically interconnected by the interconnections.

According to another aspect of the present invention, there is provided an electronic device fabrication method comprising the steps of: fabricating on a substrate an interposer comprising a base formed of a plurality of resin layers; a thin-film capacitor buried in the base, including a lower electrode, a capacitor dielectric film formed on the lower electrode, and an upper electrode formed on the capacitor dielectric film; a first through-electrode formed through the base and electrically connected to the upper electrode; and a second through-electrode formed through the base and electrically connected to the lower electrode of the thin-film capacitor, the interposer further comprising an interconnection buried in the base and electrically connected to the respective upper electrodes of a plurality of the thin-film capacitors; and a plurality of the first through-electrodes being electrically connected to the upper electrodes of said plurality of the thin-film capacitors via the interconnection; supporting the interposer by a supporting substrate; removing the substrate with the interposer supported by the supporting substrate; and mounting the interposer on another substrate.

According to the present invention, the respective upper electrodes of a plurality of thin-film capacitors are electrically interconnected by an interconnection, a plurality of through-electrodes are electrically connected to the upper electrodes of the plural thin-film capacitors by the interconnection, and the plural through-electrodes are electrically interconnected by the interconnection, whereby the probe of a test system is connected to one of the plural through-electrodes to thereby test the plural thin-film capacitors at once. According to the present invention, the plural thin-film capacitors can be tested at once without the necessity of connecting the probe sequentially to the respective through-electrodes of the plural thin-film capacitors. The test steps can be simplified.

According to the present invention, the undersurface the upper surface and the side surfaces of each thin-film capacitor are covered by the barrier film for prohibiting the diffusion of hydrogen or water, whereby the capacitor dielectric film of the thin-film capacitors are prevented from being reduced by hydrogen or water emitted from the resin layers, etc. Thus, the present invention can provide an interposer including thin-film capacitors of good electric characteristics.

According to the present invention, the conductor plugs are connected to the upper electrodes via the conductive barrier film, and through-electrodes are connected to the lower electrodes via the conductive barrier film, whereby in fabricating the interposer and using the interposer, hydrogen or water are prohibited from arriving at the upper electrodes and the lower electrodes via the conductor plugs and the through-electrodes by the conductive barrier films. Thus, the present invention can provide an interposer which can surely prevent the capacitor dielectric film of the thin-film capacitors from being reduced by hydrogen or water and includes thin-film capacitors of better electric characteristics.

According to the present invention, the base of the interposer is formed of the resin layers alone and does not use a semiconductor substrate as the base. It is not necessary to form the through-holes in the semiconductor substrate, etc., which are difficult to pass through-holes. Thus, according to the present invention, the fabrication cost of the interposer can be decreased.

According to the present invention, the interposer using the resin layers alone as the base is formed on the substrate, the substrate is removed with the interposer adhered by the supporting substrate, and the supporting substrate is removed after the interposer has been mounted on the substrate, whereby even when the base are formed of the resin layers alone, the deformation of the interposer can be prevented. Furthermore, according to the present invention, the interposer is adhered by means of the heat foaming type double-sided tape, and when the interposer does not have to be supported by the supporting substrate any more, the interposer can be removed easily from the supporting substrate. Thus, the present invention can fabricate a highly reliable electronic device at low cost.

BRIEF DESCRIPTION OF THE DRAWINGS

FIGS. 6A to 6C are sectional views of the interposer and the electronic device according to the embodiment of the present invention in the steps of the method for fabricating the interposer and the electronic device, which illustrate the method (Part 2).

DETAILED DESCRIPTION OF THE INVENTION

One Embodiment

The interposer according to a first embodiment of the present invention and the method for fabricating the interposer, and a method for fabricating an electronic device using the interposer will be explained with reference to FIGS. 1 to 18.

(Interposer and Electronic Device)

Figure 1:
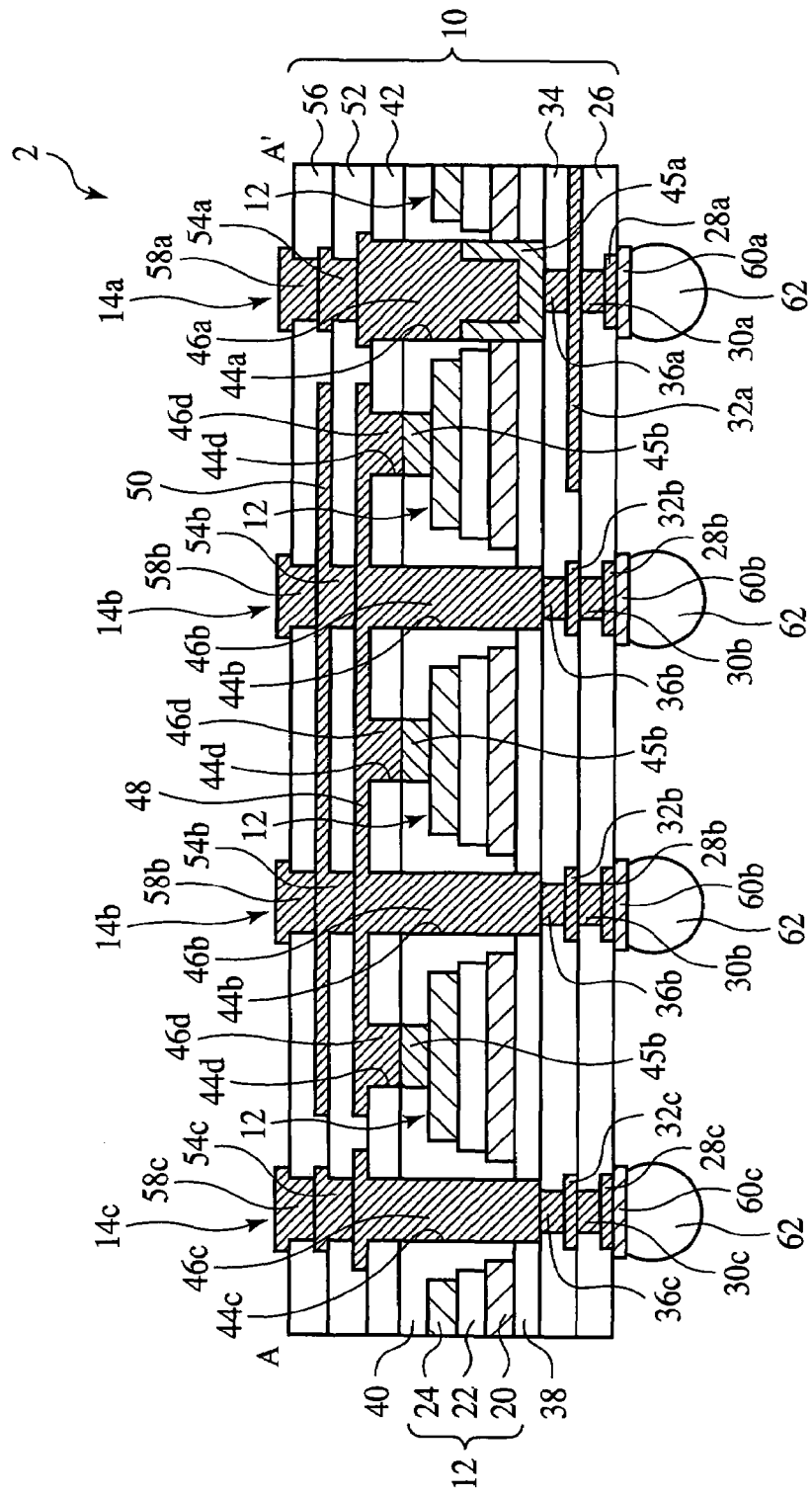
FIG. 1 is a sectional view of the interposer according to an embodiment of the present invention (Part 1)
Figure 2A:
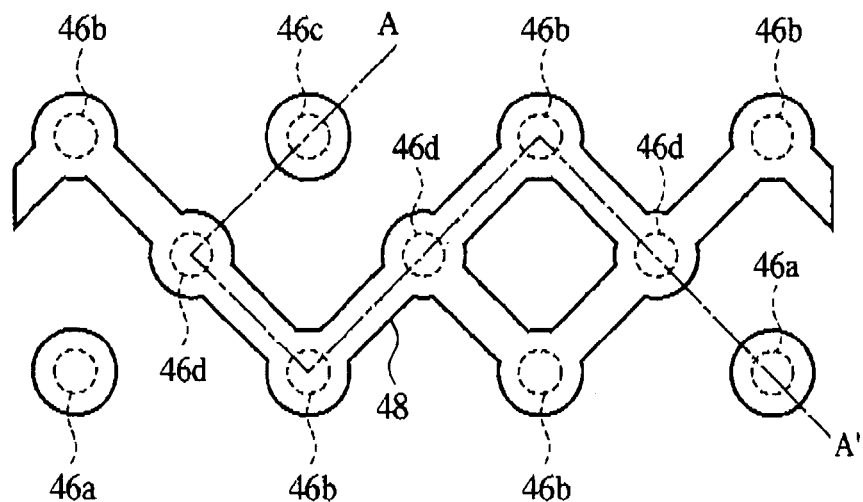
FIG. 2A is a plane view of a part of the interposer according to the embodiment of the present invention (Part 1).
Figure 2B:
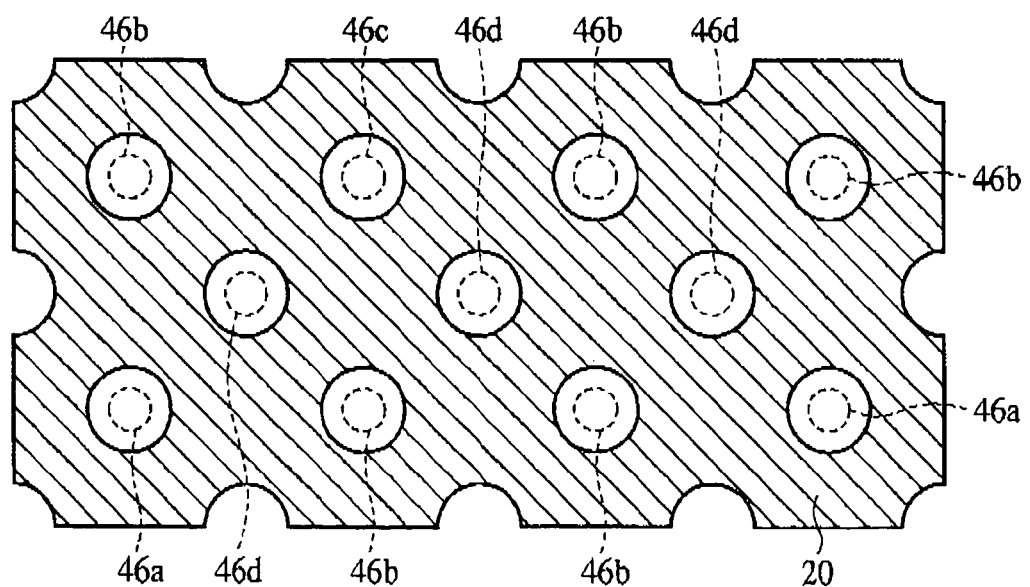
FIG. 2B is a plane view of a part of the interposer according to the embodiment of the present invention (Part 2).
Figure 3:
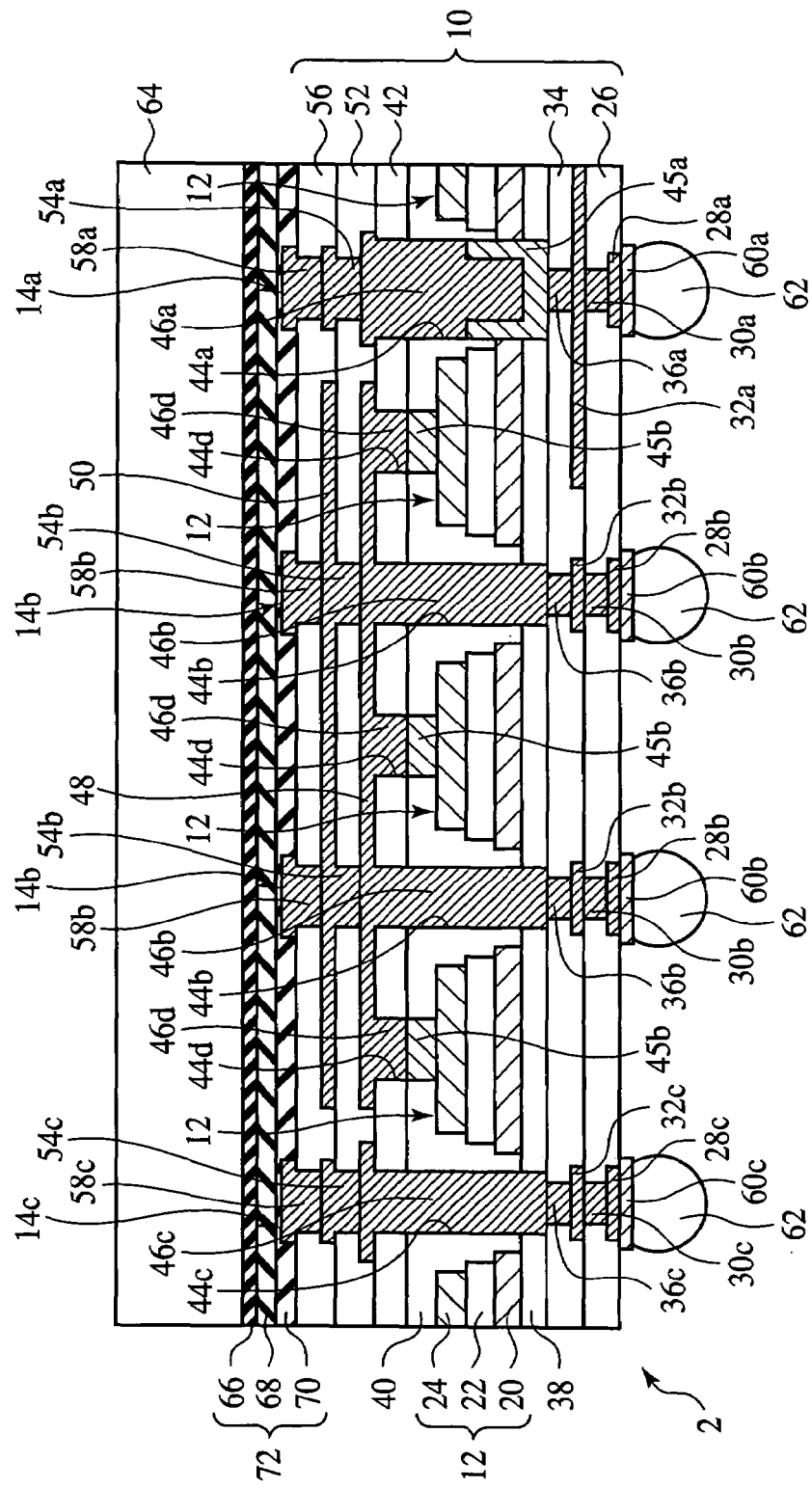
FIG. 3 is a sectional view of the interposer according to an embodiment of the present invention (Part 2).
Figure 4:
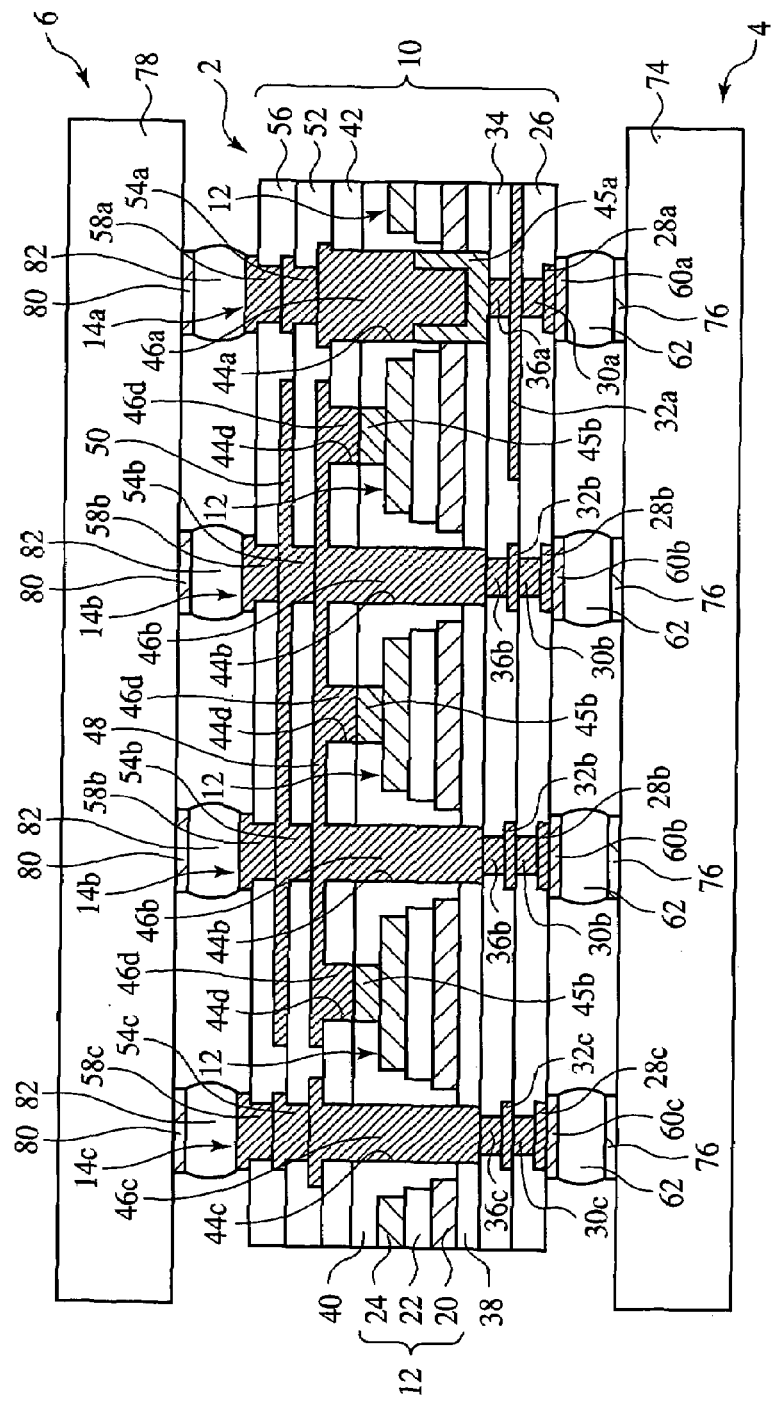
FIG. 4 is a sectional view of the electronic device according to the embodiment of the present invention.

First, the interposer and the electronic device according to the present embodiment will be explained with reference to FIG. 1. FIG. 1 is a sectional view of the interposer according to the present embodiment (Part 1). FIG. 2A is a plane view of a part of the interposer according to the present embodiment (Part 1). FIG. 2B is a plane view of a part of the interposer according to the present embodiment (Part 2). FIG. 3 is a sectional view of the interposer according to the present embodiment (Part 2). FIG. 4 is a sectional view of the electronic device according to the present embodiment.

As illustrated in FIG. 1, the interposer according to the present embodiment comprises a base 10 of a plurality of resin layers laid one on the other, a plurality of thin-film capacitors 12 buried in the base 10, a plurality of through-electrodes (vias) 14a formed through the base 10 and electrically connected to the lower electrodes 20 of the thin-film capacitors 12, a plurality of through-electrode 14b formed through the base 10 and electrically connected to the upper electrodes 24 of the thin-film capacitors 12, and a through electrode 14c for signals, formed through the base 10 and insulated from the thin-film capacitors 12.

In a resin layer 26, conduction film 28a-28c and partial electrodes 30a-30c formed on the conduction film 28a-28c are buried. The conduction film 28a-28c and the partial electrodes 30a-30c respectively form a part of the through-electrodes 14a-14c. The conduction film 28a-28c has been used as the adhesion layer in forming the partial electrodes 30a-30c, as will be described later. The conduction film 28a-28c is formed of, e.g., 150 nm-thickness Cr film and a 150 nm-thickness Cu film sequentially deposited. The resin layer 26 is formed of, e.g., polyimide resin. Polyimide resin has a 300-400° C. heat resistance temperature, which is relatively high. The thickness of the resin layer 26 is, e.g., about 5 μm.

On the resin layer 26 with the conduction film 28a-28c and the partial electrodes 30a-30b buried in, interconnections 32a and a conduction film 32b, 32c are formed. The interconnections 32a and the conduction film 32b, 32c are formed of one and the same conduction film. The interconnections 32a and the conduction film 32b are formed of, e.g., Cu. The interconnections 32a are for electrically interconnecting the plural through-electrodes 14a electrically connected to the lower electrodes 20 of the thin-film capacitors 12.

When the lower electrodes 20 of the thin-film capacitors 12 are formed solid (see FIG. 2B), the interconnections 32a are unnecessary, because the lower electrodes 20 of the respective thin-film capacitors 12 are electrically interconnected by themselves.

On the resin layer 26 with the interconnections 32a and the conduction film 32b, 32c formed on, a resin layer 34 is formed. The resin layer 34 is formed of, e.g., polyimide resin, as is the resin layer 26. The thickness of the resin layer 26 is, e.g., about 5 μm.

In a resin layer 34, partial electrodes 36a-36c are buried corresponding to the partial electrodes 30a-30c buried in the resin layer 26. The partial electrodes 36a-36c respectively form parts of the through-electrodes 14a-14c.

An insulating barrier film (reduction-resistive protection film) 38 which prohibits the diffusion of hydrogen or water is formed on the resin layer 34 with the partial electrodes 36a-36c buried in. The barrier film 38 is for the reduction of the capacitor dielectric film 22 with hydrogen or water emitted from, e.g., the resin layer 34, etc. The barrier film 38 is a barrier film of an insulating inorganic material. Specifically, the barrier film 38 is formed of, e.g., aluminum oxide (alumina $Al_2O_3$) film. The density of the barrier film 38 of aluminum oxide is preferably, e.g., 2.6 g/cm$^3$ or above. The film thickness of the barrier film 38 is, e.g., about 100 nm.

The barrier film 38 is formed of aluminum oxide film here but is not essentially formed of aluminum oxide film. The barrier film 38 may be formed suitably of an insulating inorganic material which can prohibit the diffusion of hydrogen or water.

Lower electrodes 20 are formed on the barrier film 38. The lower electrodes 20 are formed of, e.g., the layer film of TiW film (Ti—W alloy film) and Pt film sequentially laid one on the other. The composition ratio of the Ti in the TiW film is, e.g., about 10%. The film thickness of the TiW film is, e.g., 50 nm, and the film thickness of the Pt film is, e.g., 20 nm. The TiW film functions as the adhesion layer.

As illustrated in FIG. 2B the lower electrodes 20 are formed solid and the lower electrodes 20 of the plural thin-film capacitors 12 are electrically connected to each other.

The lower electrodes 20 of the thin-film capacitors 12 are formed solid here. However, the lower electrodes 20 may be formed separate from each other, and in this case, the lower electrodes 20 of the respective thin-film capacitors 12 may be electrically connected to each other by the interconnection 32a.

On the lower electrodes 20, a capacitor dielectric film 22 is formed. The capacitor dielectric film 22 is formed of a high dielectric material. More specifically, the capacitor dielectric film 22 is formed of $Ba_xSr_{1-x}TiO_3$ film (hereinafter also called "BST film"). The film thickness of the capacitor dielectric film 22 is, e.g., 100 nm. The dielectric constant of the capacitor dielectric film 22 is, e.g., about 100. The dielectric loss of the capacitor dielectric film 22 is, e.g., 1% or below.

On the capacitor dielectric film 22, upper electrodes 24 are formed opposed to the lower electrodes 20. The upper electrodes 24 are formed of, e.g., a 200 nm-thickness Pt film.

Thus, the plural thin-film capacitors 22 including the lower electrodes 20, the capacitor dielectric film 22 and the upper electrodes 24 are constituted.

On the barrier film 38 with the thin-film capacitors 12 formed on, a barrier film (reduction-resistive protection film) 40 for prohibiting the diffusion of hydrogen or water is formed. The barrier film 40 is for preventing the reduction of the capacitor dielectric film 22 with hydrogen or water emitted from, e.g., the resin layer 42, etc. The barrier film 40 is formed of, e.g., an insulating inorganic material, as is the barrier film 38. Specifically, the barrier film 40 is formed of aluminum oxide (alumna $Al_2O_3$) film. The density of the barrier film 40 of aluminum oxide is preferably, e.g., 2.6 g/cm$^3$ or above, as is that of the barrier film 38. The film thickness of the barrier film 40 is, e.g., about 100 nm.

The barrier film 40 is formed of aluminum oxide film here. However, the barrier film 40 is not essentially formed of aluminum oxide film, and in this case, the barrier film 40 may be formed suitably of an insulating inorganic material which can prevent the diffusion of hydrogen or water.

A resin layer 42 is formed on the barrier film 40. The resin layer 42 is formed of, e.g., polyimide resin, as is the resin layer 34. The thickness of the resin layer 34 is, e.g., about 5 μm.

In the resin layer 34 and the barrier film 40, openings 44a-44c arriving at the partial electrodes 36a-36c, and openings 44d arriving at the upper electrodes 24 are formed. In the openings 44a, 44d, a conductive barrier film 45a, 45b for prohibiting the diffusion of hydrogen or water is formed. The conductive barrier film 45a, 45b is formed for preventing hydrogen or water from diffusing from the through-electrodes 14a and the conductor plugs 46d to the thin-film capacitors 12 when the interposer is fabricated and when the interposer is used. The conductive barrier film 45a, 45b is formed of, e.g., an amorphous TaSiN film. The barrier film 45a, 45b is formed of an amorphous film, because when a polycrystalline film is used, hydrogen or water pass through the grain boundaries, and the diffusion of the hydrogen or water cannot be sufficiently prevented. The film thickness of the conductive barrier film 45a, 45b is, e.g., about 100 nm.

The conductive barrier film 45a, 45b is formed of TaSiN film here. However, the conductive barrier film 45a, 45b is not essentially formed of TaSiN film and can be formed suitably of a conducting material which can prevent the diffusion of hydrogen or water. For example, the conductive barrier film 45a, 45b may be formed of TiN film, TiAlN film, $IrO_2$ film or others.

Partial electrodes 46a are buried in the openings 44a with the conductive barrier film 45a formed in. In the openings 44d with the conductive barrier film 45b formed in, conductor plugs 46d are buried in. In the openings 46b, partial electrodes 46b are buried in. In the openings 44c, partial electrodes 46c are buried in.

Interconnections 48 are formed on the resin layer 42. The interconnections 48 are formed integral with the partial electrodes 46b and the conductor plugs 46d. The partial electrodes 46a-46c, the conductor plugs 46d and the interconnections 48 are formed of, e.g., Cu. The partial electrodes 46a-46c respectively form parts of the through-electrodes 14a-14c. The conductor plugs 46d electrically connect the interconnections 48 and the upper electrodes 24 to each other. The interconnections 48 electrically connect the plural thin-film capacitors 12 to the respective upper electrodes 24 to each other and electrically connect the plural through electrodes 14b to each other.

FIG. 2A is a plane view of a part of the interposer according to the present embodiment. The section of the interposer illustrated in FIG. 1 is along the A-A' line in FIG. 2A.

As illustrated in FIG. 2A, the plural conductor plugs 46d connected to the respective upper electrodes 24 of the plural thin-film capacitors 12 are electrically connected to each other by the interconnections 48. The plural partial electrodes 46b forming the through-electrodes 14b are electrically connected to each other by the interconnections 48. Thus, all the upper electrodes 24 of the plural thin-film capacitors 12 are electrically connected to all the plural through electrodes 14b.

The interconnections 48 may be wired all over the surface of the interposer 12. Otherwise, it is possible that the interconnections 48 may be formed in a plural number, and these plural interconnections 48 are electrically connected to each other by other interconnections 50. In FIG. 1, a plurality of the interconnections 48 are formed, and the plural interconnections 48 are electrically connected to each other by other interconnections 50. Thus, the upper electrodes 24 of the plural thin-film capacitors 12 are connected to each other by the interconnections 48, etc. In other words, the upper electrodes 24 of the plural thin-film capacitors 12 are connected to a common potential by the interconnections 48, etc.

A resin layer 52 is formed on the resin layer 42 with the partial electrodes 46a-46c, the conductor plugs 46d and the interconnections 48 formed on. The resin layer 52 is formed of, e.g., polyimide resin, as is the resin layer 42. The thickness of the resin layer 52 is, e.g., about 5 μm.

In the resin layer 52, partial electrodes 54a-54c are buried corresponding to the partial electrodes 46a-46c. The partial electrodes 54a-54c form parts of the through electrodes 14a-14c.

On the resin layer 52 with the partial electrodes 54a-54c buried in, interconnections 50 are formed. The interconnections 50 are for electrically interconnecting the plural interconnections 48.

A resin layer 56 is formed on the resin layer 52 with the partial electrodes 54a-54c and the interconnections 50 formed on. The resin layer 56 is formed of, e.g., polyimide resin, as is the resin layer 52. The thickness of the resin layer 56 is, e.g., about 5 μm.

In the resin layer 56, partial electrodes 58a-58c are buried corresponding to the partial electrodes 54a-54c. The partial electrodes 58a-58c form parts of the through-electrodes 14a-14c.

Thus, the plural resin layers 26, 34, 42, 52, 56 form the base 10. In the base 10, a plurality of the through-electrodes 14a formed of the partial electrodes 30a, 36a, 46a, 54a, 58a, etc. are buried. In the base 10, a plurality of the through-electrodes 14b formed of the partial electrodes 30b, 36b, 46b, 54b, 58b, etc. are also buried. In the base 10, a plurality of the through-electrodes 14c are formed of the partial electrodes 30c, 36c, 46c, 54c, 58c, etc. are buried.

The plural through-electrodes 14b are electrically interconnected via the interconnections 48. The upper electrodes 24 of the plural thin-film capacitors 12, which are electrically interconnected via the interconnections 48, are electrically connected to the plural through-electrodes 14b.

The plural through-electrodes 14a are electrically connected to the lower electrodes 20 of the plural thin-film capacitors 12. The lower electrodes 20 of the plural thin-film capacitors 12 are formed solid (see FIG. 2B) or are electrically interconnected by the interconnections 32a. Thus, the lower electrodes 20 of the plural thin-film capacitors 12 are electrically connected to the plural through-electrodes 14a.

The plural through-electrodes 14c are insulated from the thin-film capacitors 12.

Electrode pads 60a-60c are formed on the underside of the base 10 corresponding to the through-electrodes 14a-14c. The electrodes pads 60a-60c are connected to the respective through-electrodes 14a-14c.

Solder bumps 62 are formed on the electrode pads 60a-60c.

Thus, the interposer 2 according to the present embodiment is constituted.

As illustrated in FIG. 3, the interposer 2 is supported by a supporting substrate 64.

That is, the supporting substrate 64 is adhered to the resin layer 56 with the heat foaming type double-sided tape 72. The supporting substrate 64 is, e.g., a glass supporting substrate.

The heat foaming type double-sided tape 72 includes a base 68 of, e.g., polyester film, a heat-releasable adhesive layer 70 formed on one side of the base 68, and a pressure-sensitive adhesive layer 66 formed on the other side of the base 68. In the heat foaming type double-sided tape 72, at the room temperature, the heat-releasable adhesive layer 70 adheres to an object-to-be adhered, as the general pressure-sensitive adhesive layer and, when it is heated up, the heat-releasable adhesive layer 70 is foamed and decreases the adhesiveness to the object-to-be-adhered due to the decrease of the adhesion area and released from the object-to-be-adhered.

The pressure-sensitive adhesive layer 66 of the heat foaming type double-sided tape 72 is adhered to the supporting substrate 64, and the heat-releasable adhesive layer 70 of the heat foaming type double-sided tape 72 is adhered to the resin layer 56.

In the present embodiment, the interposer 2 is supported by the supporting substrate 64, because the base 10 of the interposer 2 is formed only of the resin layers 26, 34, 42, 52, 56, and the interposer 2 will be deformed unless supported by some rigid means.

As will be described later, after the interposer 2 has been mounted on a substrate 4 (see FIG. 4), the interposer 2 is supported by the substrate 4, and the supporting substrate 64 supporting the interposer 2 becomes unnecessary. The supporting substrate 64 is adhered to the interposer 2 with the heat foaming type double-sided tape 72 so as to facilitate releasing the supporting substrate 64 from the interposer 2, when the interposer 2 is not required any more to be adhered by the supporting substrate 64.

FIG. 4 is a sectional view of the electronic device using the interposer according to the present embodiment.

As illustrated in FIG. 4, the interposer 2 according to the present embodiment is disposed, e.g., between the circuit board (package substrate) 4 and semiconductor integrated circuit device 6.

The circuit board 4 includes a substrate 74 with multi-level interconnections (not illustrated) and electrode pads 76 formed on the substrate 74. The electrode pads 76 are electrically connected to any one of the multi-level interconnections buried in the substrate 74.

The electrode pads 60a-60c of the interposer 2 and the electrode pads 76 of the circuit board 4 are electrically connected to each other by the solder bumps 62.

The semiconductor integrated circuit device 6 includes a semiconductor substrate 78, electrode pads 80 formed on one primary surface of the semiconductor substrate 78 (opposed to the interposer 2), and solder bumps 82 formed on one surfaces of the electrode pads 80 (opposed to the interposer 2). The semiconductor substrate 78 is, e.g., a silicon substrate. On the semiconductor substrate 78, an integrated circuit (not illustrated) including electronic circuit elements (not illustrated) is formed. On the semiconductor substrate 78 with such electronic circuit elements formed on, a multi-layer interconnection structure (not illustrated) including a plurality of inter-layer insulation films (not illustrated) and interconnection layers (not illustrated) is formed. The multi-layer interconnection structure electrically interconnects the electronic circuit elements (not illustrated). Any one of the interconnections formed in a plurality of layers is connected to the electrode pads 80.

The electrode pads 80 of the semiconductor integrated circuit devices 6 and the through-electrodes 14a-14c of the interposer 2 are electrically connected to each other by solder bumps 82.

Thus, the electronic device using the interposer according to the present embodiment is constituted.

The interposer 2 according to the present embodiment is characterized mainly in that the interconnections 48 electrically interconnecting the respective upper electrodes 24 of the plural thin-film capacitors 12 are buried in the base 10, and the plural through-electrodes 14b are electrically connected to the upper electrodes 24 of the plural thin-film capacitors 12 via the interconnections 48, and the plural through-electrodes 14b are electrically interconnected by the interconnections 48.

According to the present embodiment, the respective upper electrodes 24 of the plural thin-film capacitors 12 are electrically interconnected by the interconnections 48, the plural through-electrodes 14b are electrically connected to the upper electrodes 24 of the thin-film capacitors 12 via the interconnections 48, and the plural through-electrodes 14b are electrically connected to each other by the interconnections 48, whereby the probe of a test device is connected to any one of the plural through-electrodes 14b to thereby test the plural thin-film capacitors 12 at once. According to the present embodiment, the plural thin-film capacitors 12 can be tested at once without the necessity of connecting the probe sequentially to the respective through-electrodes connected to the thin-film capacitors 12, which can simplify the test steps. According to the present embodiment, the test steps can be simplified, which contributes to the cost reduction of the interposer 2.

The interposer 2 according to the present embodiment is also characterized in that the thin-film capacitors 12 have the undersurfaces, the upper surfaces and the side surfaces covered by the barrier films 38, 40 for prohibiting the diffusion of hydrogen or water.

According to the present embodiment, the thin-film capacitors 12 are covered by such barrier films 38, 40, whereby the capacitor dielectric film 22 of the thin-film capacitors 12 are prevented from being reduced with hydrogen, water, etc. emitted by the resin layers 34, 42, etc. Thus, according to the present embodiment, the interposer 2 can include the thin-film capacitors having good electric characteristics.

The interposer 2 according to the present embodiment is mainly characterized in that the conductor plugs 46d are connected to the upper electrodes 24 via the conductive barrier film 45b, and the through-electrodes 14a are connected to the lower electrodes 20 via the conductive barrier film 45a.

According to the present embodiment, the conductive barrier film 45b is formed between the conductor plugs 46d and the upper electrodes 24, and the conductive barrier film 45a is formed between the through-electrodes 14a and the lower electrodes 20, whereby, in fabricating the interposer or using the interposer, hydrogen or water are prohibited from arriving at the upper electrodes 24 and the lower electrodes 20 via the conductor plugs 46b and the through-electrodes 46a. Thus, according to the present embodiment, the reduction of the capacitor dielectric film 22 of the thin-film capacitors 12 can be more surely prohibited, and the interposer 2 can include the thin-film capacitors 12 of better electric characteristics.

The interposer according to the present embodiment is mainly characterized in that the base 10 is formed only of the resin layers 26, 34, 42, 52, 56, and the base 10 is not a semiconductor substrate or others is not used as a base 10.

When the base of the interposer 2 is a semiconductor substrate or others, it is not easy to form through-holes in the semiconductor substrate. Accordingly, when the base is a semiconductor substrate or others, it is difficult to reduce the cost of the interposer.

However, in the present embodiment, the base 10 is formed only of the resin layers 26, 34, 42, 52, 56, which makes it much easy to form through-holes in the resin layers. 26, 34, 42, 52, 56 forming the base 10. Thus, according to the present embodiment, the cost reduction of the interposer can be realized.

The electronic device uses such an interposer, and according to the present embodiment, the electronic device can reduce the cost and can have good electric characteristics.

(Method for Fabricating the Interposer and the Electronic Device)

Next, the method for fabricating the interposer and the electronic device according to the present embodiment will be explained with reference to FIGS. 5A to 18. FIGS. 5A to 18 are sectional views of the interposer and the electronic device according to the present embodiment in the steps of the method for fabricating the interposer and the electronic device, which illustrate the method.

Figure 5A:
FIGS. 5A to 5D are sectional views of the interposer and the electronic device according to the embodiment of the present invention in the steps of the method for fabricating the interposer and the electronic device, which illustrate the method (Part 1).
Figure 5B:
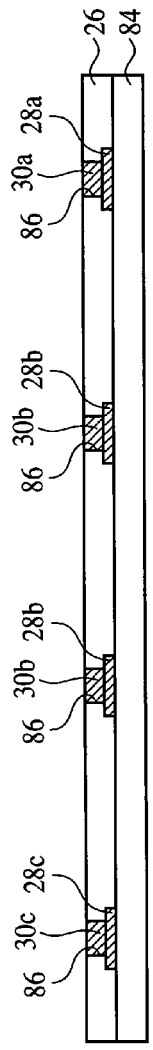
Figure 5C:
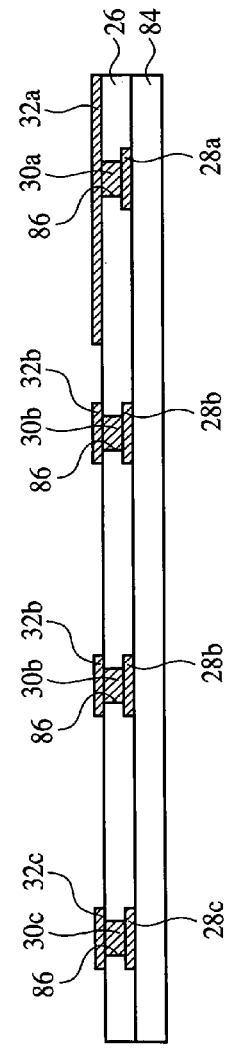
Figure 5D:
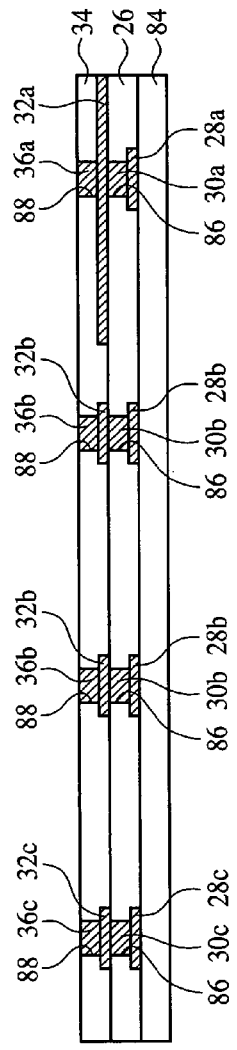

As illustrated in FIG. 5A, a semiconductor substrate 84 is prepared. The semiconductor substrate 84 is a silicon wafer which has not been cut in a chip size. The thickness of the semiconductor substrate 84 is, e.g., 0.6 mm.

Next, a layer film of a Cr film and a Cu film sequentially deposited is formed on the semiconductor substrate 84 by, e.g., sputtering. The film thickness of the Cr film is, e.g., 150 nm, and the film thickness of the Cu film is, e.g., 250 nm.

Next, the layer film is patterned by photolithography. Thus, the conduction film 28a-28c of the layer film is formed.

Next, the resin layer 26 is formed on the semiconductor substrate 84 by, e.g., spin coating. The resin layer 26 is formed of, e.g., photosensitive polyimide resin.

The resin layer 26 can be formed as exemplified below. First, a polyimide resin solution is applied to the semiconductor substrate 84 by spin coating. Conditions for applying the polyimide solution are, e.g., 1000 rpm and 30 seconds. Then, thermal processing (pre-bake) is made on the resin layer 26. The thermal processing temperature is, e.g., 90° C.

Next, openings 86 are formed in the resin layer 26 by photolithography technique. The openings 86 are for the partial electrodes 30a-30c which are to be parts of the through-electrodes 14a-14c to be respectively buried in.

Next, thermal processing (main-bake) is made on the resin layer 26. The thermal processing temperature is, e.g., 400° C. Thus, the resin layer 26 of, e.g., an about 5 μm-thickness is formed.

Next, a seed layer (not illustrated) of a Cr film and a Cu film sequentially deposited is formed on the entire surface by, e.g., a sputtering method.

Next, a photoresist film (not illustrated) is formed on the entire surface by the spin coating method.

Next, openings (not illustrated) are formed in the photoresist film (not illustrated) by photolithography. The openings are formed corresponding to the openings 86 formed in the resin layer 26.

Then, a plated film of, e.g., Cu is formed in the openings 86 by electroplating. The thickness of the plated film is, e.g., about 6 μm. Thus, the partial electrodes 30a-30c of the plated film are formed respectively in the openings 86. Then, the photoresist film is released (see FIG. 5B).

Next, a photoresist film (not illustrated) is formed on the entire surface by the spin coating method.

Next, openings (not illustrated) are formed in the photoresist film (not illustrated) by the photolithography technique, which are the interconnections 32a and the conduction film 32b, 32c.

Next, a plated film of, e.g., Cu is formed in the openings by the electroplating method. The thickness of the plated film is, e.g., about 6 μm. Thus, the interconnections 32a and the conduction film 32b, 32c of the plated film are formed respectively in the openings. Then, the photoresist film is removed (see FIG. 5C).

Then, the seed layer (not illustrated) exposed around the interconnections 32a and the conduction film 32b, 32c is removed by wet etching. The etchant is, e.g., an about 1-10% ammonium persulfate aqueous solution. The etching period of time is, e.g., about 2 minutes. When the seed layer is etched off, the surfaces of the interconnections 32a and the conduction film 32b, 32c are a little etched off, but the seed layer whose thickness is sufficiently smaller than the sizes of the interconnections 32a and the conduction film 32b, 32c, can be etched in a shorter period of time, and the interconnections 32a and the conduction film 32b, 32c are never excessively etched.

Next, the resin layer 34 is formed on the entire surface by, e.g., the spin coating method. The resin layer 34 is, e.g., photosensitive polyimide resin.

The resin layer 34 is formed as exemplified below. A polyimide resin solution is applied by spin coating. Conditions for applying the polyimide resin solution are, e.g., 1000 rpm and 30 seconds. Then, thermal processing (pre-bake) is made on the resin layer 34. The thermal processing temperature is, e.g., 90° C.

Next, the openings 88 are formed in the resin layer 34 by the photolithography technique. The openings 88 are for the partial electrodes 36a-36c which are to be parts of the through-electrodes 14a-14c to be buried in.

Next, thermal processing (main bake) is made on the resin layer 34. The thermal processing temperature is, e.g., 400° C. Thus, the resin layer 34 of, e.g., about 5 μm-thickness is formed.

Next, the seed layer of a Cr film and a Cu film sequentially deposited is formed on the entire surface by, e.g., a sputtering method.

Next, a photoresist film (not illustrated) is formed on the entire surface by spin coating.

Next, the openings (not illustrated) are formed in the photoresist film (not illustrated) by photolithography. The openings are formed corresponding to the openings 88 formed in the resin layer 34.

Then, a plated film of, e.g., Cu is formed in the openings 88 by electroplating. The thickness of the plated film is, e.g., about 6 μm. Thus, the partial electrodes 36a-36c of the plated film are formed respectively in the openings 88. Then, the photoresist film is released (see FIG. 5D).

Next, the seed layer (not illustrated) on the resin layer 34 is removed by wet etching. The etchant is, e.g., an about 1-10% ammonium persulfate aqueous solution. The etching period of time is, e.g., about 2 minutes.

Next, as illustrated in FIG. 6A, the insulating barrier film (reduction-resistive protection film) 38 for prohibiting the diffusion of hydrogen or water is formed on the entire surface by, e.g., a sputtering method. As the insulating barrier film 38, aluminum oxide film, for example, is formed. The density of the barrier film 38 of aluminum oxide is preferably, e.g., 2.6 g/cm$^3$ or above. The barrier film 38 of such relatively high density is formed so that the barrier film surely shuts off hydrogen or water emitted from the resin layer 34. The film thickness of the barrier film 38 is, e.g., about 100 nm.

The conditions for forming the barrier film 38 of aluminum oxide are as exemplified below. The substrate temperature is, e.g., 80° C. The applied electric power is, e.g., 500 W. The gas pressure inside the film forming chamber is, e.g., 0.1 Pa. The flow rate ratio between argon gas and oxygen gas is, e.g., 5:1.

Next, a TiW film (Ti—W alloy film) and a platinum (Pt) film are sequentially laid on the entire surface by, e.g., sputtering to form the conduction film 20. The conduction film 20 is to be the lower electrodes 20 of the thin-film capacitors 12. The TiW film functions as an adhesion layer. The thickness of the TiW film is, e.g., 50 nm. The thickness of the Pt film is, e.g., 200 nm.

In forming the TiW film, it is preferable to do sputtering by using a DC sputtering system while a RF bias power for the substrate is being applied. The RF bias for the substrate is applied in forming the TiW film for the following reason. That is, when the TiW film is simply formed, the TiW film often has a very high compressive film stress for the substrate. When the film stress of the TiW film is opposite to the direction of the film stress of the resin layer 34, there is a risk that cracks, etc. may be formed in the resin layer 34. When the TiW film is formed by sputtering with the substrate bias being applied, the growth of the crystal grains of the TiW is accelerated, and the TiW film can have a small film stress. Then, in the present embodiment, the TiW film is formed by the sputtering with the RF bias being applied.

Next, the conduction film 20 is patterned into a prescribed configuration by a photolithography technique. Specifically, the openings 90 for the through-electrodes 14a-14c to be formed in are formed in the conduction film 20. The conduction film 20 formed solid remains generally solid even after patterned, and the lower electrodes 20 of the plural thin-film capacitors 12 are electrically interconnected.

The conduction film forming the lower electrodes 20 is formed, e.g., solid here. However, the lower electrodes 20 may not be formed solid. For example, the conduction film 20 may be patterned to form the lower electrodes 20 separate from each other. In this case, the plural lower electrodes 20 are electrically interconnected by the interconnections 32a.

Thus, the lower electrodes 20 of the thin-film capacitors 12 are formed as illustrated in FIG. 6B.

Then, the capacitor dielectric film 22 is formed on the entire surface by, e.g., the sputtering method. As the capacitor dielectric film 22, $Ba_xSr_{1-x}TiO_3$ (BST) film for example, is formed. BST can have a relatively high dielectric constant (about 1500 in bulk) and is a useful material for realizing thin-film capacitors which are small and has large capacitance. The film thickness of the capacitor dielectric film 22 is, e.g., 100 nm.

The conditions for forming the capacitor dielectric film 22 of BST are as exemplified below. The substrate temperature is, e.g., 200° C. The gas pressure inside the film forming chamber is, e.g., 0.1 Pa. The flow rate ratio between argon gas and oxygen gas is, e.g., 4:1. The applied electric power is, e.g., 500 W. The film forming period of time is, e.g., 30 minutes. The capacitor dielectric film 22 formed under these conditions can have good electric characteristics of an about 100 dielectric constant and a dielectric loss of 1% or below.

As the capacitor dielectric film 22, BST film is formed here. However, the capacitor dielectric film 22 is not essentially formed of BST film and may be formed suitably of a material of high dielectric constant.

Then, the capacitor dielectric film 22 is patterned into a prescribed configuration by photolithography. The capacitor dielectric film 22 is patterned by, e.g., argon ion milling.

Thus, as illustrated in FIG. 6C, the capacitor dielectric film 22 of the thin-film capacitors 12 is formed.

Next, the conduction film 24 of, e.g., Pt is formed on the capacitor dielectric film 22 by, e.g., sputtering. The conduction film 24 is to be the upper electrodes 24 of the thin-film capacitors 12. The film thickness of the conduction film 24 is, e.g., 200 nm.

Next, the conduction film is patterned into a prescribed configuration by photolithography. The conduction film 24 is patterned by, e.g., argon ion milling. Thus, the upper electrodes 24 of the conduction film are formed.

Figure 7A:
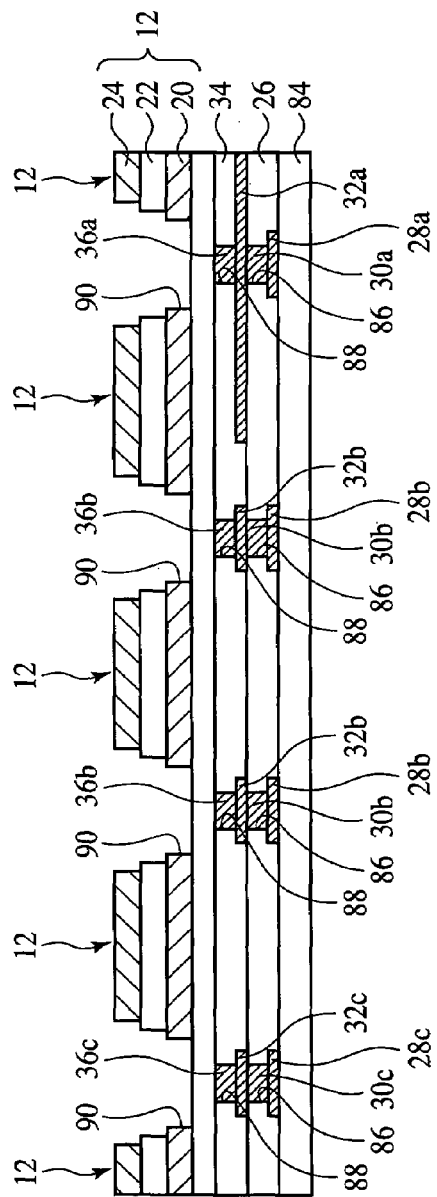
FIGS. 7A and 7B are sectional views of the interposer and the electronic device according to the embodiment of the present invention in the steps of the method for fabricating the interposer and the electronic device, which illustrate the method (Part 3).

Thus, the plural thin-film capacitors 12 having the lower electrodes 20, the capacitor dielectric film 22 ad the upper electrodes 24 are formed (see FIG. 7A).

Figure 7B:
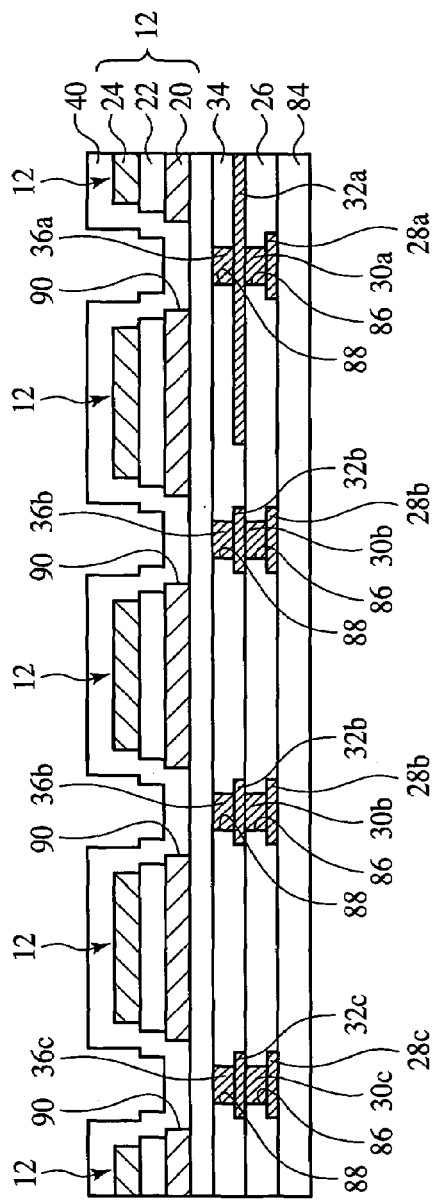

Next, the insulating barrier film (reduction-resistive protection film) 40 for prohibiting the diffusion of hydrogen or water is formed on the entire surface by, e.g., sputtering (see FIG. 7B). The insulating barrier film 40 is formed of, e.g., aluminum oxide film. Preferably, the density of the barrier film 40 formed of aluminum oxide is, e.g., 2.6 g/cm$^3$ or above, as is that of the barrier film. The barrier film 40 of such relatively high density is formed so as to more surely shut off hydrogen or water emitted from the conduction layer 42, etc. to be formed in later steps. The film thickness of the barrier film 40 is, e.g., about 100 nm. Conditions for forming the barrier film 40 are the same as those for forming the barrier film 38 described above.

Then, the conduction layer 42 is formed on the entire surface. The resin layer is formed of, e.g., photosensitive polyimide resin.

The resin layer 42 can be formed as exemplified below.

First, a silane coupling agent is applied to the entire surface by spin coating. The silane coupling agent is, e.g., aminopropyl triethoxysilane ($NH_2(CH_2)_3Si(OCH_2)_3$). Conditions for applying the silane coupling agent are e.g., 1500 rpm and 30 seconds.

Then, thermal processing is made with a hot plate to cure the silane coupling agent. The thermal processing temperature is, e.g., 90° C.

Next, a photosensitive polyimide resin solution is applied. Conditions for applying the polyimide resin solution are, e.g., 1500 rpm and 30 seconds.

Then, the openings 44a-44d are formed in the resin layer 42 by photolithography. The openings 44a-44d are from the partial electrodes 46a-46c to be parts of the through-electrodes 14a-14c to be buried in and are formed down to the partial electrodes 36a-36c. The openings 44d are for the conductor plugs 46d to be buried in and are formed down to the upper electrodes 24 of the thin-film capacitors 12 (see FIG. 8A).

Then, thermal processing (main bake) is made on the resin layer 42. The thermal processing temperature is, e.g., 400° C. The film thickness of the resin layer 42 after subjected to the thermal processing is, e.g., about 5 μm.

Then, a conductive barrier film for prohibiting the diffusion of hydrogen or water is formed on the entire surface by, e.g., sputtering. The conductive barrier film is for preventing the diffusion of hydrogen or water from the through-electrodes 14a-14c to the thin-film capacitors 12 when the through-electrodes 14a-14c are formed in later steps or when the complete interposer 2 is used. As the conductive barrier film is, the amorphous TaSiN film, for example, is formed. The amorphous film is formed as the conductive barrier film, however, when a polycrystalline film is used, hydrogen or water pass through the grain boundaries, and the diffusion of hydrogen or water cannot be sufficiently prohibited. The film thickness of the conductive barrier film is, e.g., about 100 nm.

Next, a photoresist film (not illustrated) is formed on the entire surface by spin coating.

Next, the photoresist film is patterned by the photolithography technique. In a patterning of the photoresist film, the photoresist film is left in the openings 44a and the openings 44d.

Next, with the photoresist film as the mask, the conductive barrier film is etched off. Then, the photoresist film is removed.

Figure 8A:
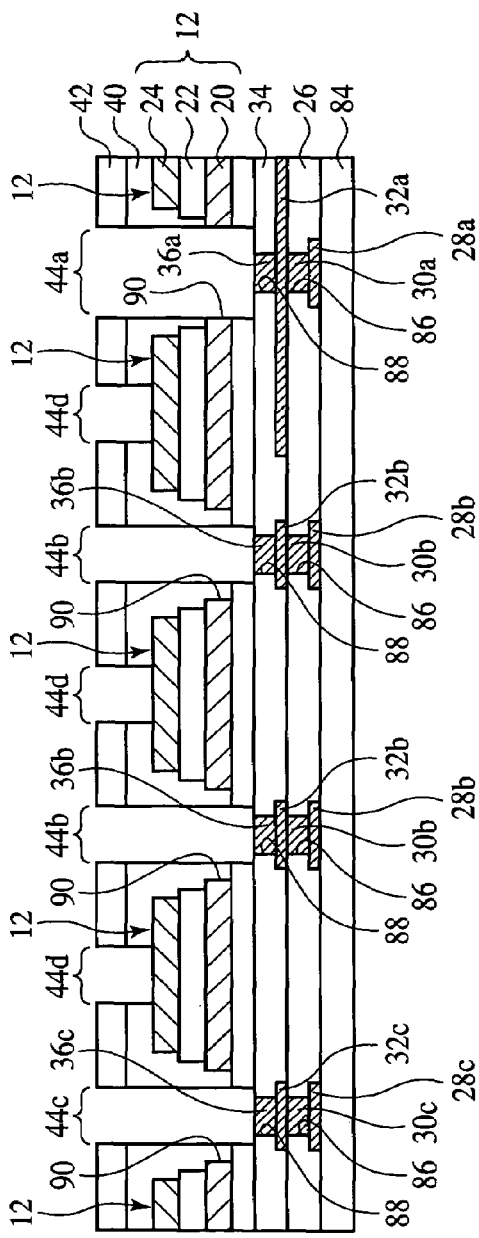
FIGS. 8A and 8B are sectional views of the interposer and the electronic device according to the embodiment of the present invention in the steps of the method for fabricating the interposer and the electronic device, which illustrate the method (Part 4).
Figure 8B:
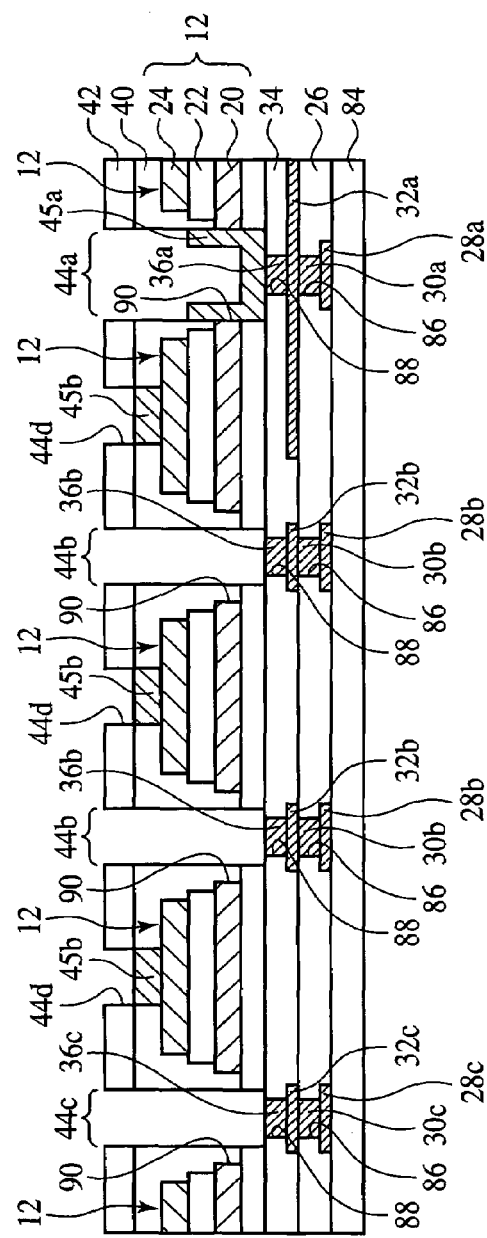
Figure 9A:
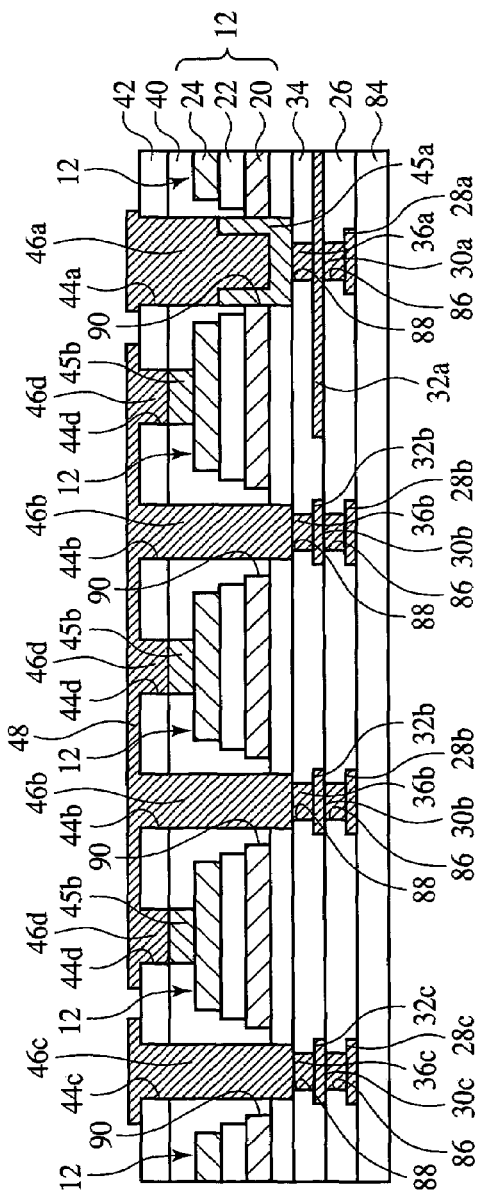
FIGS. 9A and 9B are sectional views of the interposer and the electronic device according to the embodiment of the present invention in the steps of the method for fabricating the interposer and the electronic device, which illustrate the method (Part 5).
Figure 9B:
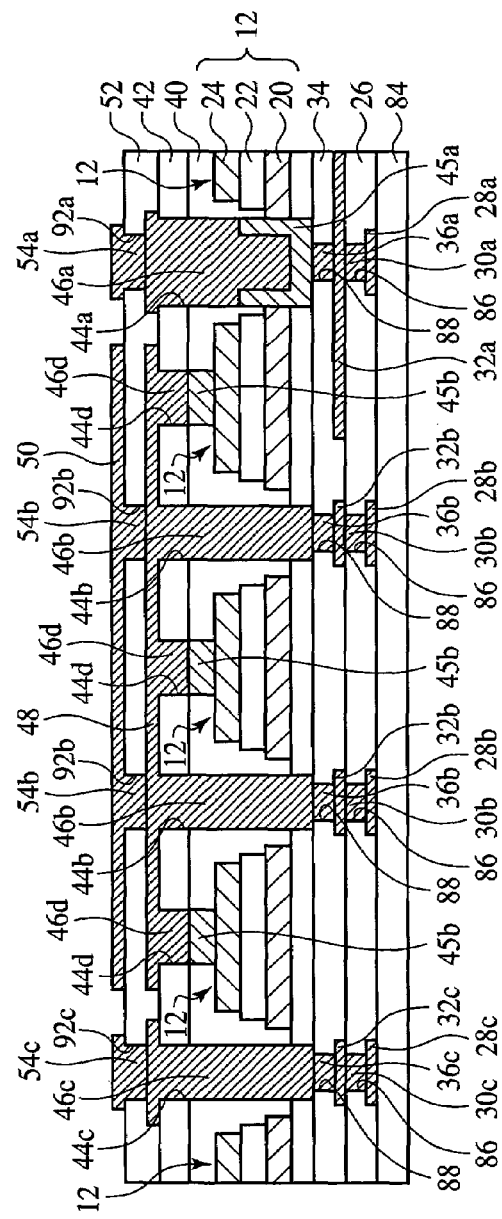
Figure 10:
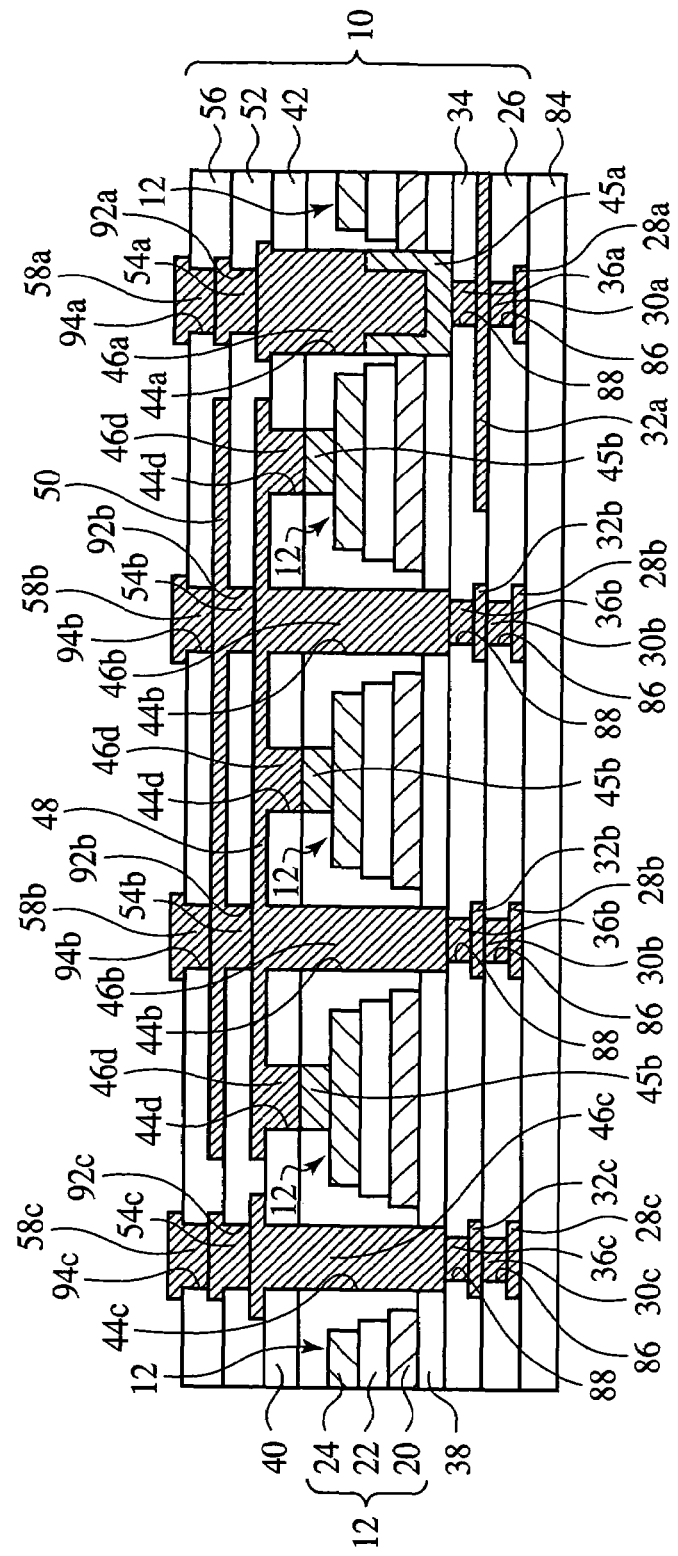
FIG. 10 is a sectional view of the interposer and the electronic device according to the embodiment of the present invention in the steps of the method for fabricating the interposer and the electronic device, which illustrates the method (Part 6).

Thus, as illustrated in FIG. 8B, the conductive barrier film 45a is formed in the openings 44a, and the conductive barrier film 45b is formed in the openings 44d.

The conductive barrier film 45a, 45b is formed of TaSiN film here. However, the conductive barrier film 45a, 45b are not essentially formed by TaSiN film and can be formed suitably of a conducting material which can prevent from the diffusion of hydrogen or water. For example, the conductive barrier film 45a, 45b may be formed by TiN film, TiAlN film or others.

Then, the seed layer (not illustrated) of a Cr film and a Cu film sequentially laid is formed on the entire surface by, e.g., the sputtering method.

Then, a photoresist film (not illustrated) is formed on the entire surface by the spin coating method.

Next, the openings (not illustrated) are formed in the photoresist film by the photolithography technique. The openings are for forming the conductor plugs 46d, the partial electrodes 46a-46c and the interconnections 48.

Then, a plated film of, e.g., Cu is formed in the openings by electroplating. The thickness of the plated film is, e.g., about 6 μm. Thus, the conductor plugs 46d, the partial electrodes 46a-46c and the interconnections 48 of the plated film are formed. Then, the photoresist film is released (see FIG. 9A).

The seed layer (not illustrated) exposed around the conductor plugs 46d, the partial electrodes 46a-46c and the interconnections 48 is removed by a wet etching. The etchant is, e.g., an about 1-10% ammonium persulfate aqueous solution. The etching period of time is, e.g., about 2 minutes.

Then, the resin layer 52 is formed on the entire surface. The resin layer 52 is formed by, e.g., photosensitive polyimide resin. The resin layer 52 can be formed as exemplified below. First, a photosensitive polyimide resin solution is applied. Conditions for applying the photosensitive polyimide resin solution are, e.g., 1500 rpm and 30 seconds. Next, the openings 92a-92c are formed in the resin layer 52 by photolithography. The openings 92a-92c are for the partial electrodes 54a-54c to be buried in and are formed down to the partial electrodes 46a-46c.

Next, the thermal processing (main bake) is made on the resin layer 52. The thermal processing temperature is, e.g., 400° C. The film thickness of the resin layer 52 after subjected to the thermal processing is, e.g., about 3 μm.

Then, a seed layer (not illustrated) of a Cr film and a Cu film sequentially laid is formed on the entire surface by, e.g., sputtering.

Next, a photoresist film (not illustrated) is formed on the entire surface by spin coating.

Next, the openings (not illustrated) are formed in the photoresist film by the photolithography technique. The openings are for forming the partial electrodes 54a-54c and the interconnections 50.

Then, a plated film of, e.g., Cu is formed in the openings by electroplating. The thickness of the plated film is, e.g., about 6 μm. Thus, the partial electrodes 54a-54c of the plated film are formed in the openings 92a-92c while the interconnections 50 are formed on the resin layer 52. Then, the photoresist film is released (see FIG. 9B).

Then, the seed layer (not illustrated) exposed around the partial electrodes 54a-54c is removed by wet etching. The etchant is, e.g., a 1-10% ammonium persulfate aqueous solution. The etching period of time is, e.g., about 2 minutes.

Next, the resin layer 56 is formed on the entire surface. The resin layer 56 is formed of, e.g., photosensitive polyimide resin. The resin layer 56 is formed as exemplified below. First, a photosensitive polyimide resin solution is applied. Conditions for applying the polyimide resin solution are, e.g., 1500 rpm and 30 seconds. Next, the openings 94a-94c are formed in the resin layer 56 by photolithography. The openings 94a-94c are for the partial electrodes 58a-58c to be buried in and are formed down to the partial electrodes 54a-54c.

Next, the thermal processing (main bake) is made on the resin layer 56. The thermal processing temperature is, e.g., 400° C. The film thickness of the resin layer 56 after subjected to the thermal processing is, e.g., about 5 μm.

Next, a seed layer (not illustrated) of a Cr film and a Cu film sequentially laid is formed on the entire surface by, e.g., the sputtering method.

Next, a photoresist film (not illustrated) is formed on the entire surface by the spin coating method.

Next, openings (not illustrated) are formed in the photoresist film by photolithography. The openings are for forming the partial electrodes 58a-58c.

Next, a plated film of, e.g., Cu is formed in the openings by electroplating. The thickness of the plated film is, e.g., about 6 μm. Thus, the partial electrodes 58a-58c of the plated film are formed in the openings 94a-94c. Then, the photoresist film is removed (see FIG. 10).

Next, the exposed seed layer (not illustrated) is removed by a wet etching. The etchant is, e.g., a 1-10% ammonium persulfate aqueous solution. The etching period of time is, e.g., about 2 minutes.

Figure 11A:
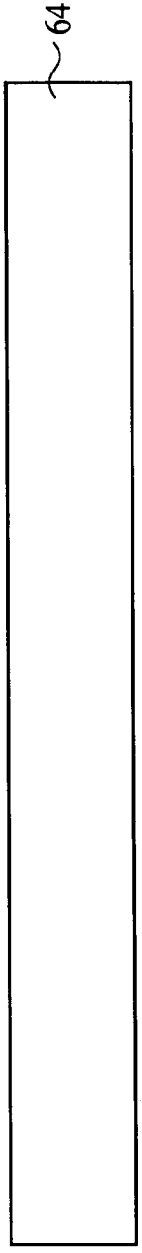
FIGS. 11A to 11C are sectional views of the interposer and the electronic device according to the embodiment of the present invention in the steps of the method for fabricating the interposer and the electronic device, which illustrate the method (Part 7).

Then, as illustrated in FIG. 11A, the supporting substrate 64 is prepared. The supporting substrate 64 is, e.g., a glass supporting substrate. The supporting substrate 64 is for supporting the interposer 2 when the semiconductor substrate 84 is removed by polish or others in later steps.

Figure 11B:
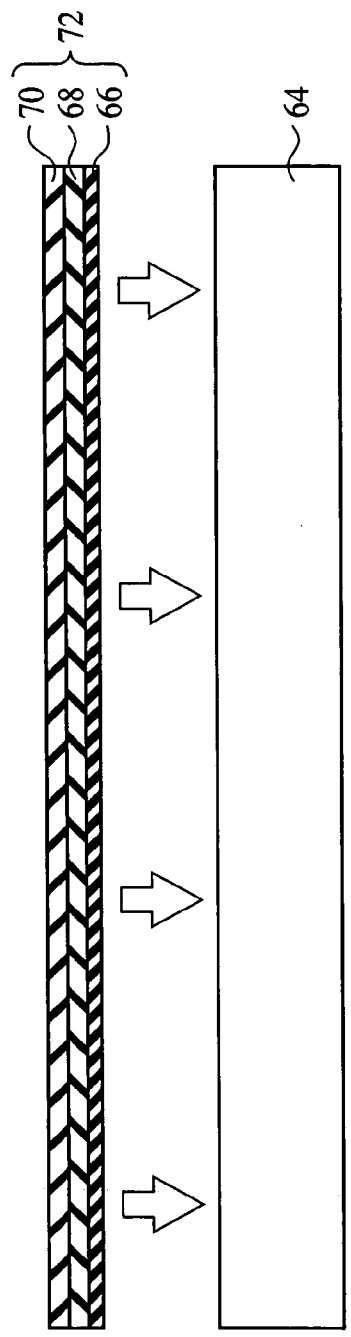
Figure 11C:
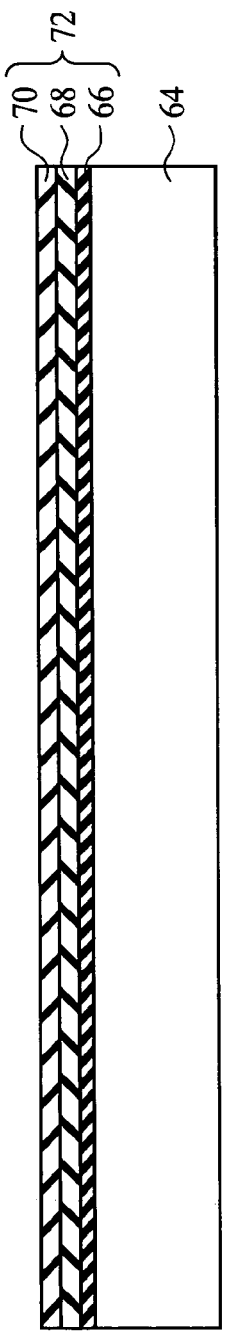

Next, as illustrated in FIG. 11B, the heat foaming type double-sided tape 72 is adhered to the supporting substrate 64. As described above, the heat foaming type double-sided tape 72 includes the base 68 of, e.g., polyester film, the heat-releasable adhesive layer 66 formed on one primary surface of the base 68, and the pressure-sensitive adhesive layer 70 formed on the other primary surface of the base 68. As described above, the heat foaming type double-sided tape 72 has the heat-releasable adhesive layer 70 adhered to an object-to-be-adhered at the room temperature, as is the general pressure-sensitive adhesive layer and, when it is heated up, foamed to thereby decrease the adhesion to the object-to-be-adhered and released from the object-to-be-adhered. As such the heat foaming type double-sided tape 72, a heat foaming type double-sided tape by, e.g., NITTO DENKO CORPORATION (trade name; RIVA ALPHA) or others. When the heat foaming type double-sided tape 72 is adhered to the supporting substrate, the pressure-sensitive adhesive layer 66 of the heat foaming type double-sided tape 72 is adhered to the supporting substrate 64 (see FIG. 11C).

Figure 12:
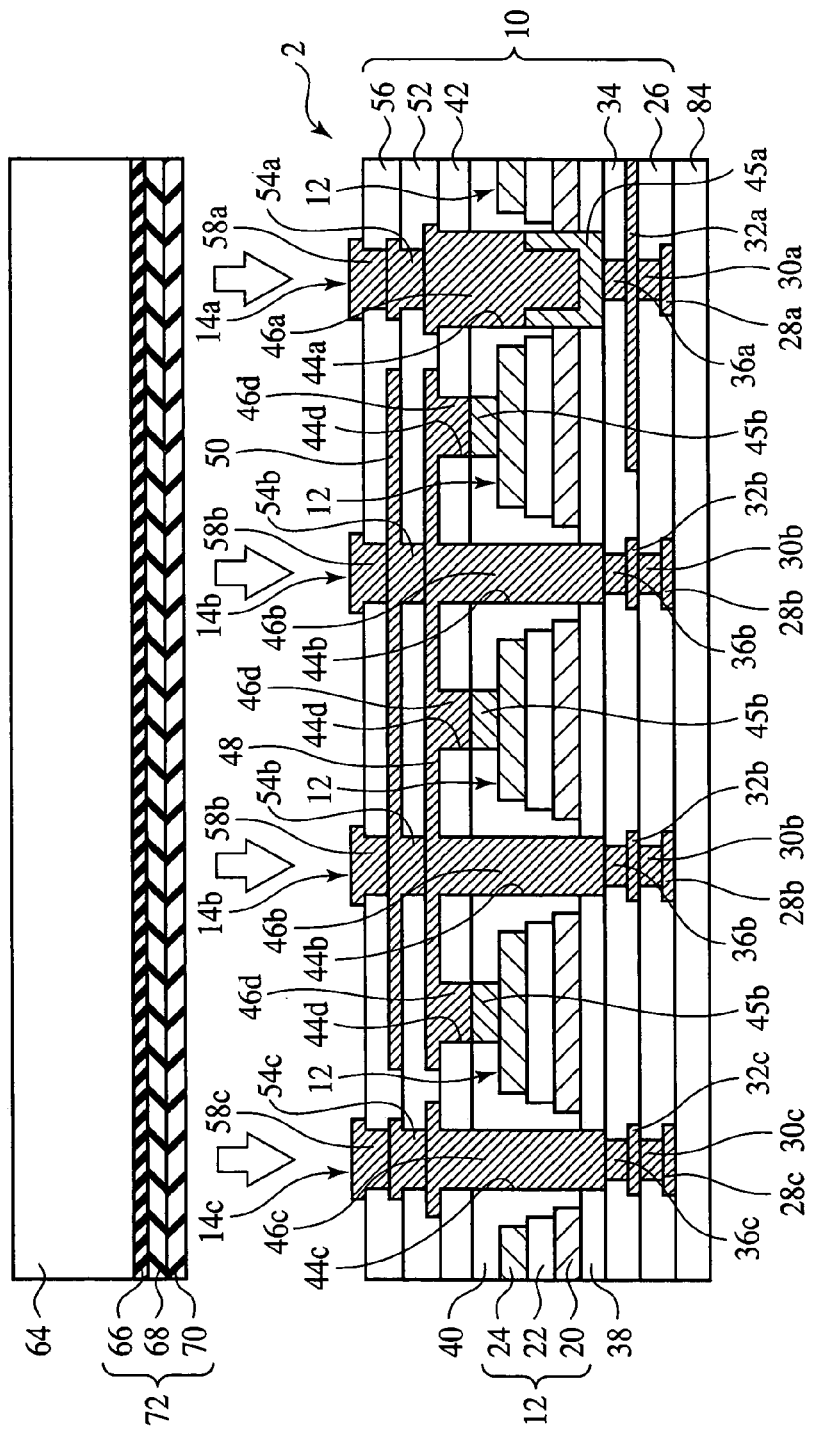
FIG. 12 is a sectional view of the interposer and the electronic device according to the embodiment of the present invention in the steps of the method for fabricating the interposer and the electronic device, which illustrates the method (Part 8).

Next, as illustrated in FIG. 12, the semiconductor substrate 84 and the supporting substrate 64 are opposed to each other. At this time, the semiconductor substrate 84 and the supporting substrate 64 are opposed to each other with the heat-releasable adhesive layer 70 of the heat foaming type double-sided tape 72 being near the resin layer 56.

Figure 13:
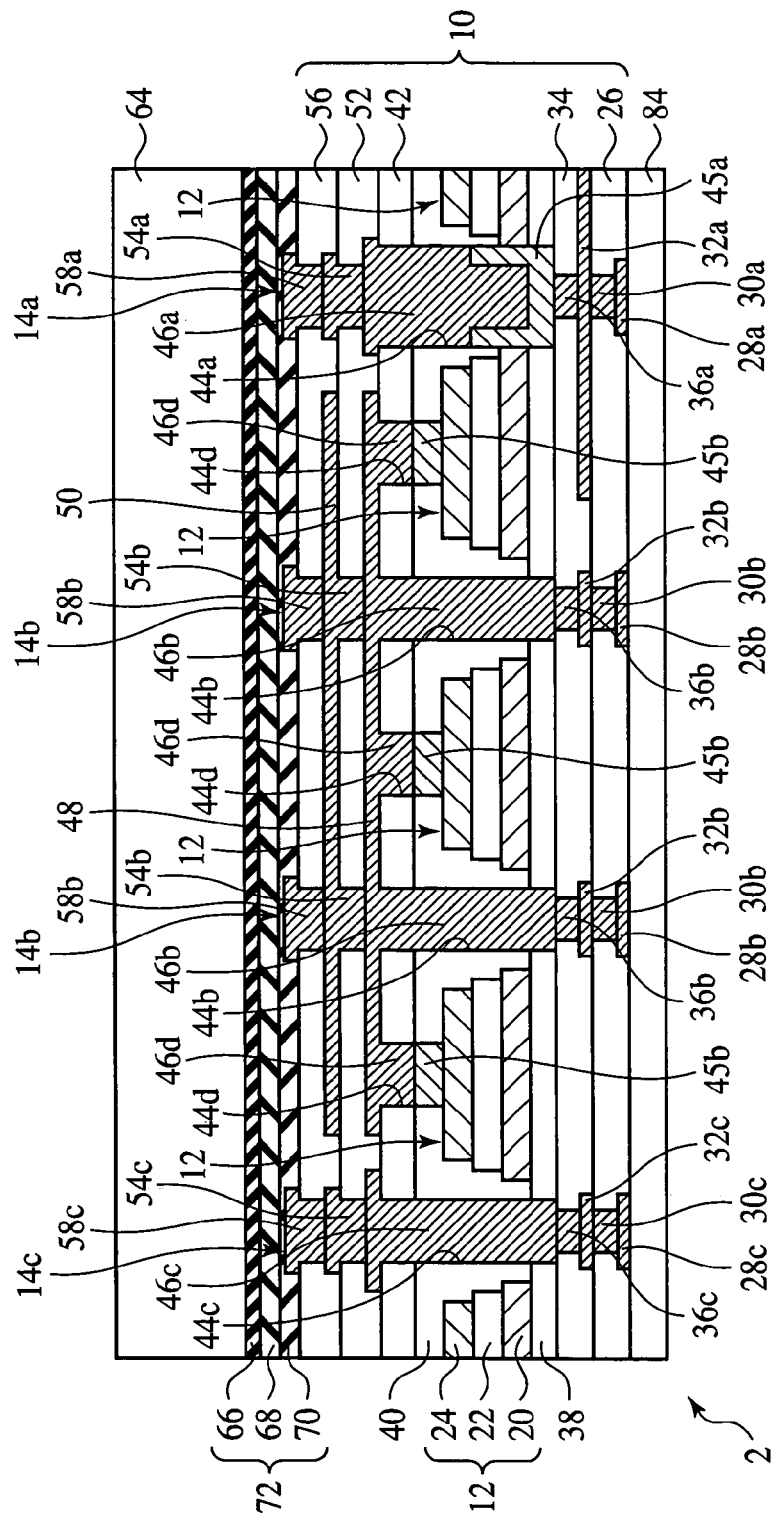
FIG. 13 is a sectional view of the interposer and the electronic device according to the embodiment of the present invention in the steps of the method for fabricating the interposer and the electronic device, which illustrates the method (Part 9).

Next, as illustrated in FIG. 13, the heat-releasable adhesive layer 66 of the heat foaming type double-sided tape 72 and the resin layer 56 are adhered to each other.

Next, the semiconductor substrate 84 is polished by, e.g., CMP until the thickness of the semiconductor substrate 84 becomes, e.g., about 100 μm. At this time, all the semiconductor substrate 84 is not removed, because the conduction film 28a-28c, etc. are prevented from being damaged by the polish.

Next, the semiconductor substrate 84 remaining on the underside of the resin layer (opposite to the surface contacting the resin layer 34) is etched off by, e.g., fluoro-nitric acid.

Figure 14:
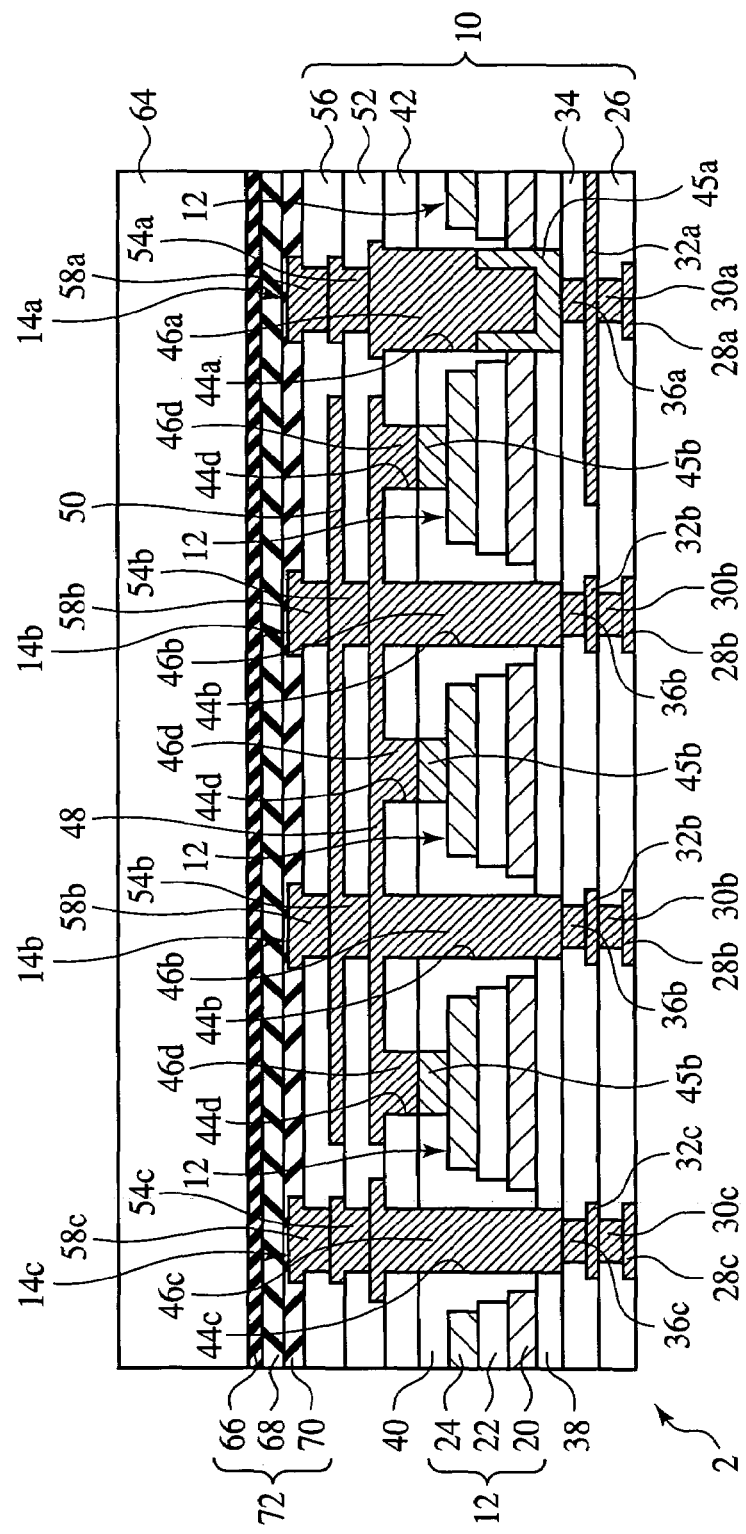
FIG. 14 is a sectional view of the interposer and the electronic device according to the embodiment of the present invention in the steps of the method for fabricating the interposer and the electronic device, which illustrates the method (Part 10).

Thus, the semiconductor substrate 84 is removed while the conduction film is prevented from being excessively damaged (see FIG. 14).

Then, a seed layer (not illustrated) of a Ni film and a Cu film sequentially laid is formed on one surface of the resin layer 26 (opposite to the surface contacting the resin layer 34).

Next, a photoresist film (not illustrated) is formed by spin coating on the entire surface of the resin layer 26 with the seed layer formed on.

Next, the openings (not illustrated) are formed in the photoresist film by photolithography. The openings are for forming the electrode pads 60a-60c.

Next, a plated film of, e.g., Ni is formed in the openings by electroplating. The thickness of the plated film is, e.g., about 4 μm. Thus, the electrode pads 60a-60c are respectively formed in the openings.

Next, the photoresist film is released.

Then, the exposed seed layer (not illustrated) is removed by wet etching. The etchant is, e.g., an about 1-10% ammonium persulfate aqueous solution. The etching period of time is, e.g., about 2 minutes.

Then, the solder bumps 62 of, e.g., Sn-based solder are formed on one surfaces of the electrodes pads 60a-60c (opposite to the surfaces contacting the conduction film 28a-28c) by electroplating.

Figure 15:
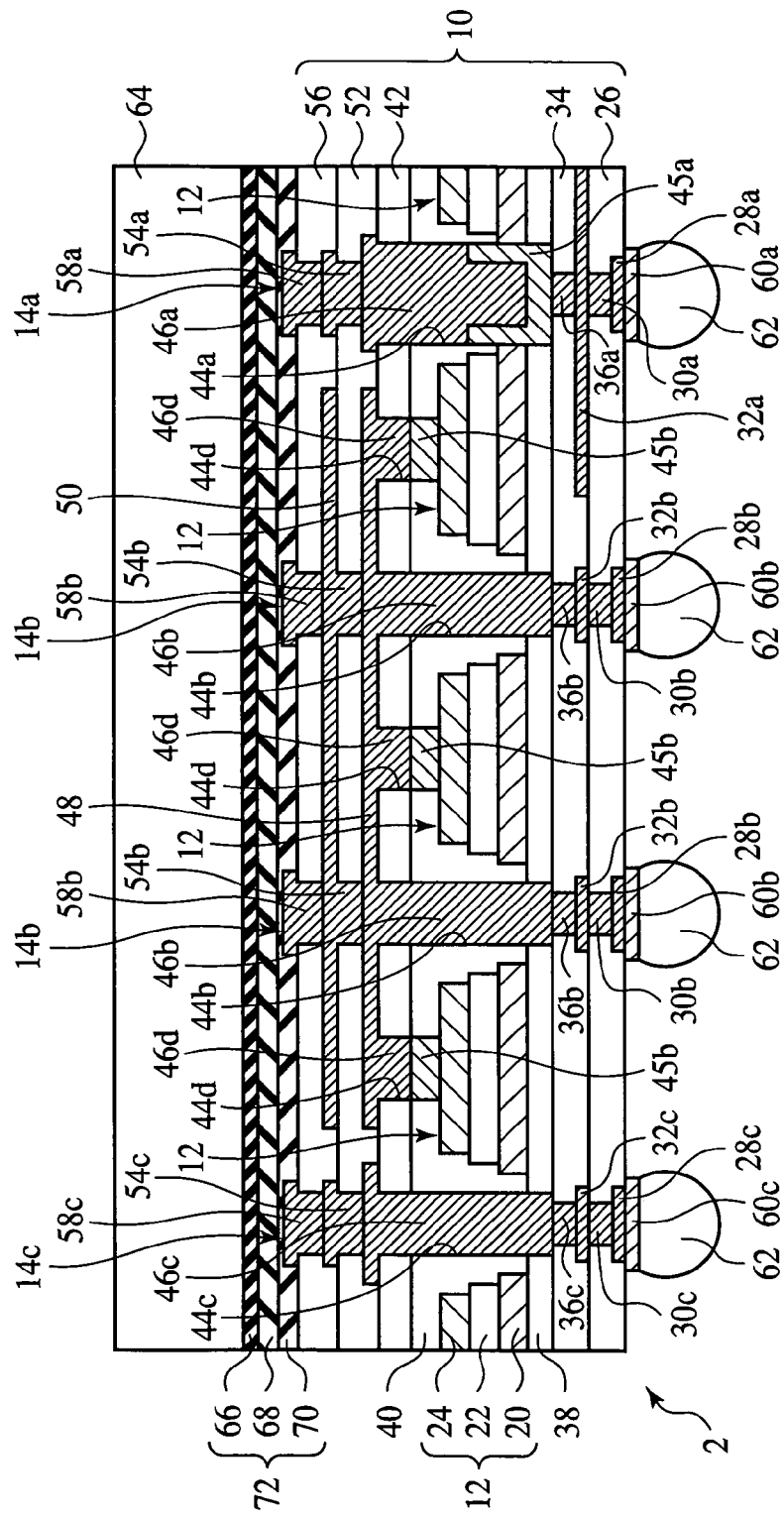
FIG. 15 is a sectional view of the interposer and the electronic device according to the embodiment of the present invention in the steps of the method for fabricating the interposer and the electronic device, which illustrates the method (Part 11).
Figure 16:
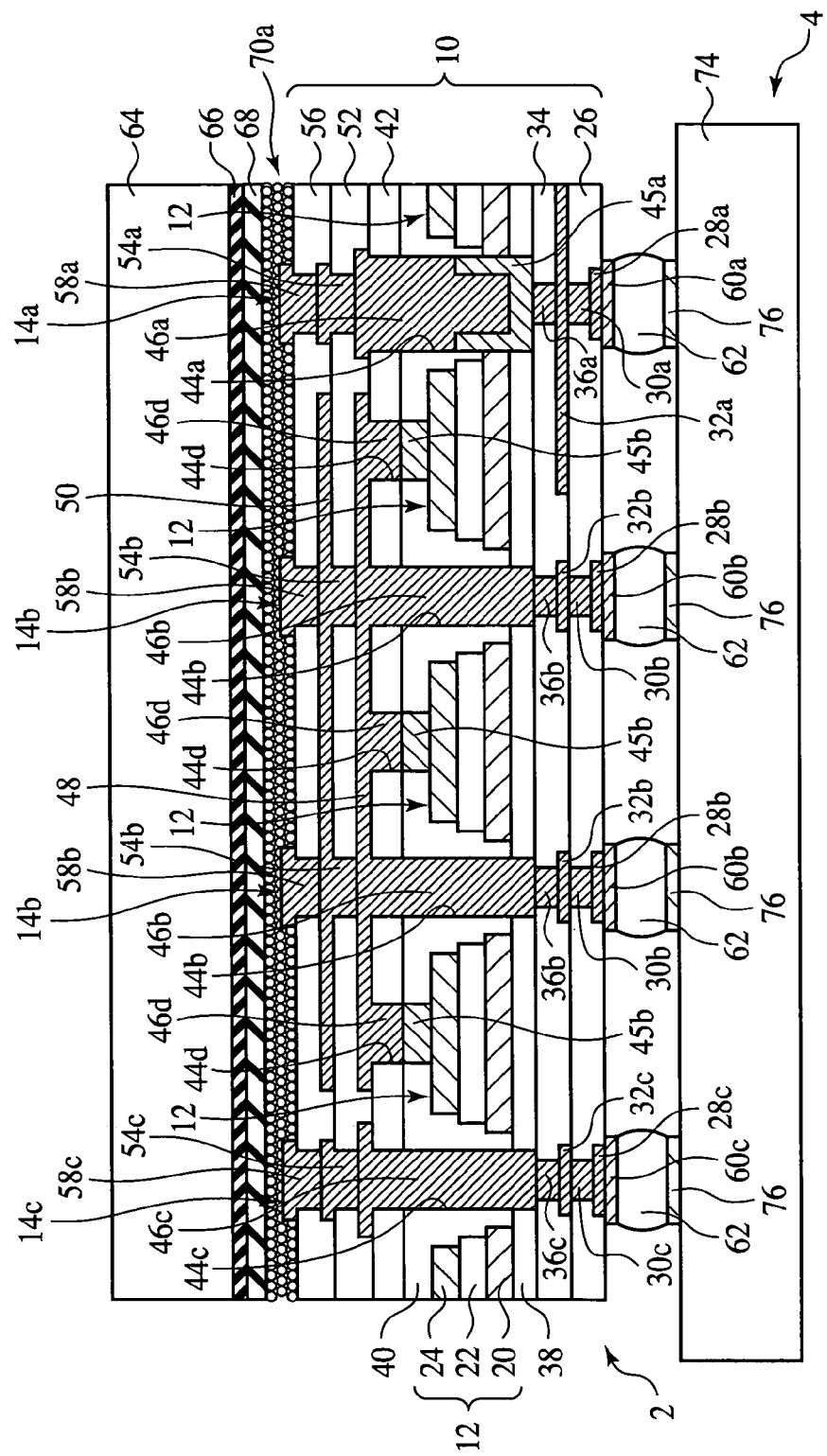
FIG. 16 is a sectional view of the interposer and the electronic device according to the embodiment of the present invention in the steps of the method for fabricating the interposer and the electronic device, which illustrates the method (Part 12).
Figure 17:
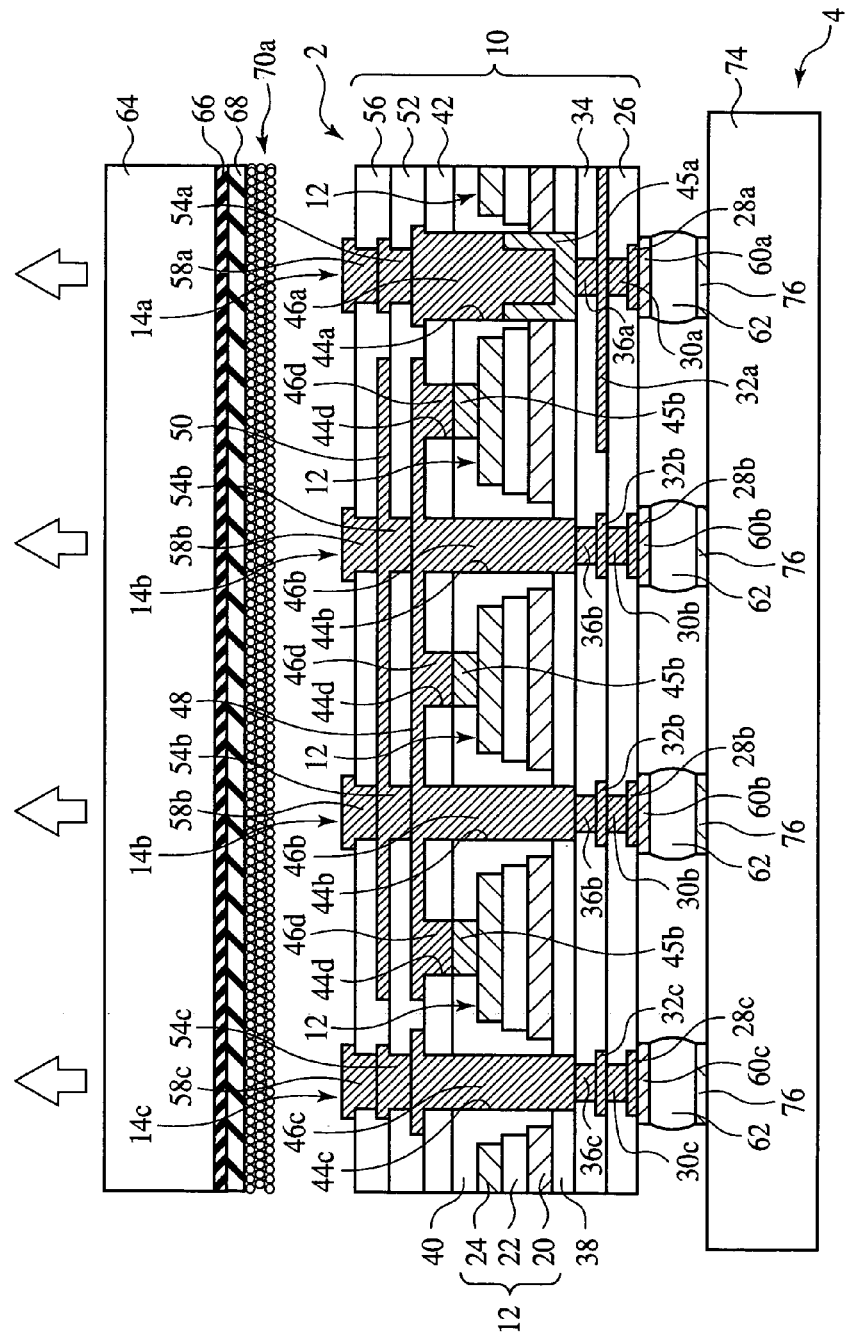
FIG. 17 is a sectional view of the interposer and the electronic device according to the embodiment of the present invention in the steps of the method for fabricating the interposer and the electronic device, which illustrates the method (Part 13).
Figure 18:
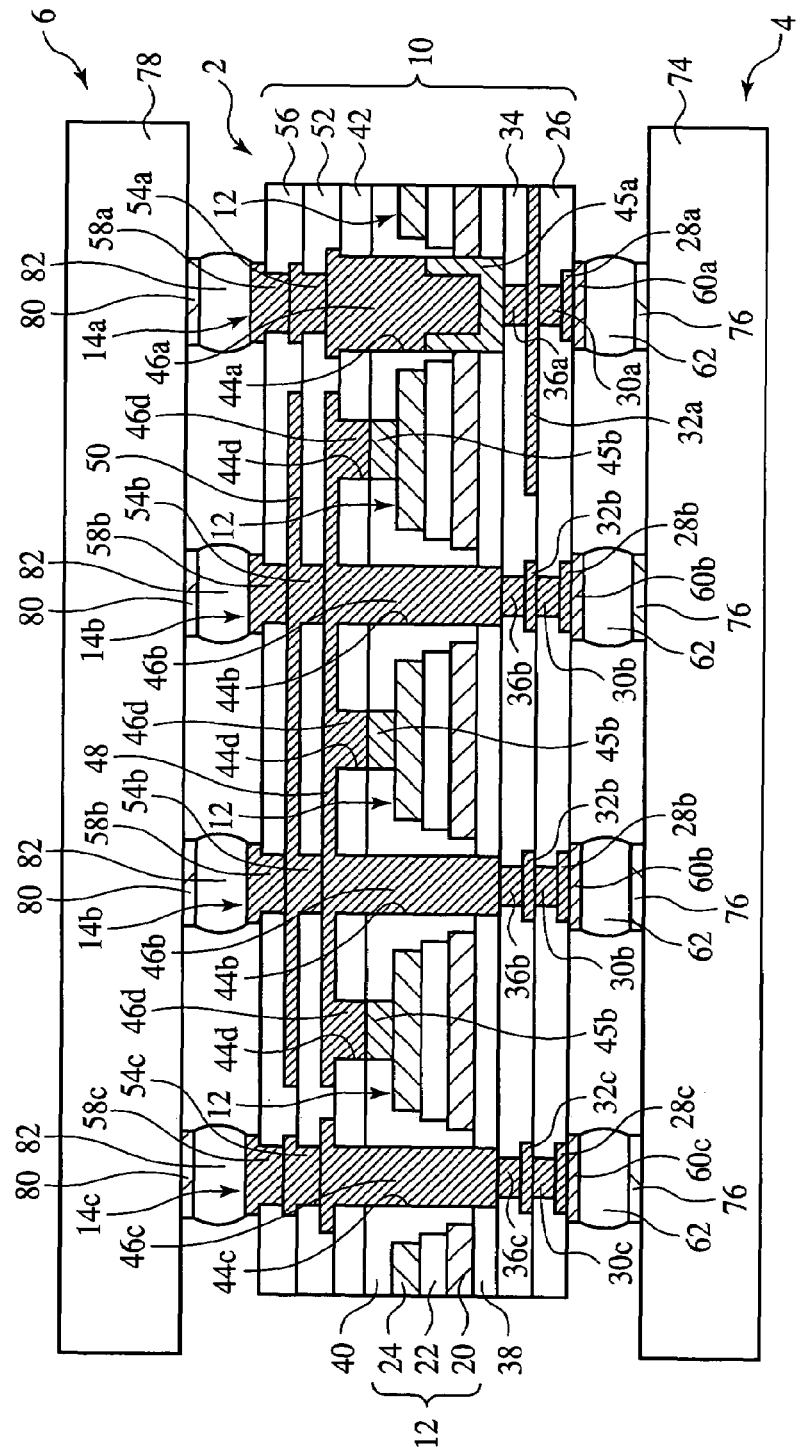
FIG. 18 is a sectional view of the interposer and the electronic device according to the embodiment of the present invention in the steps of the method for fabricating the interposer and the electronic device, which illustrates the method (Part 14).

Thus, the interposer 2 according to the present embodiment is fabricated (see FIG. 15).

Next, the circuit board (package substrate) 4 is prepared. The circuit board 4 includes the substrate 74 with multi-layer interconnections (not illustrated) buried in, and the electrode pads 76 formed on the substrate 74. The electrode pads 76 are electrically connected to anyone (not illustrated) of the multi-layer interconnections buried in the substrate 74.

Next, the interposer 2 supported by the supporting substrate 64 and the circuit board 4 are opposed to each other. At this time, the interposer 2 and the circuit board 4 are opposed to each other with the solder bumps 62 of the interposer 2 and the electrode pads 76 of the circuit board 4 being near each other.

Then, the solder bumps 62 of the interposer 2 and the electrode pads 76 of the circuit board 4 are jointed by flip-chip bonding. Thus, the interposer 2 is mounted on the circuit board 4. To joint the solder bumps 62 to the electrode pads 76, the thermal processing which needs to solve the solder bumps 62 has been done. The thermal processing temperature is, e.g., about 160° C. Accordingly, in the flip-chip bonding, the heat-releasable adhesive layer 70 of the heat foaming type double-sided tape 72 is foamed. When the heat-releasable adhesive layer 70 is foamed, the adhesion area between the foamed heat-releasable adhesive layer 70a and the resin layer 56 is decreased, and the adhesion between the heat-releasable adhesive layer 70a and the resin layer 56 is reduced. Thus, the heat-releasable adhesive layer 70a and the resin layer 56 can be easily released from each other.

Next, the supporting substrate 64 is removed from the interposer 2. The heat foaming type double-sided tape 72 having the pressure-sensitive adhesive layer 66 thereof adhered to the supporting substrate 64 is removed from the interposer 2 together with the supporting substrate 64 (see FIG. 17).

Then, the semiconductor integrated circuit device 6 is prepared. The semiconductor integrated circuit device 6 includes the electrode pads 80 formed on one primary surface of the semiconductor substrate 78 (opposed to the interposer 2), and the solder bumps 82 formed on one surfaces of the electrode pads 80 (opposed to the interposer 2). The semiconductor substrate 78 is, e.g., a silicon substrate. An integrated circuit including electronic circuit elements (not illustrated) is formed on one primary surface of the semiconductor substrate 78 (opposed to the interposer 2). That is, electronic circuit elements (not illustrated), such as the active elements, such as transistors, and/or passive elements (not illustrated), such as capacitor elements, etc., are disposed on one primary surface of the semiconductor substrate 78. On one primary surface of the semiconductor substrate 78 (opposed to the interposer 2) with the electronic circuit elements formed on, a multi-layer interconnection structure (not illustrated) including a plurality of inter-layer insulation films (not illustrated) and interconnection layers (not illustrated) is formed. This multi-layer interconnection structure electrically interconnects the electronic circuit elements. Anyone of the interconnections formed in the plural layers is connected to the electrode pads 80.

Next, the solder bumps 82 of the semiconductor integrated circuit device 6 are jointed to the through-electrodes 14a-14c of the interposer 2 by flip-chip bonding. Thus, the semiconductor integrated circuit device 6 is mounted on the interposer 2 (see FIG. 18).

Thus, the electronic device using the interposer according to the present embodiment is fabricated.

The electronic device fabricating method according to the present embodiment is characterized mainly in that the interposer 2 using only the resin layers 26, 34, 42, 52, 56 as the base 10 is formed on the semiconductor substrate 84, the semiconductor substrate 84 is removed with the interposer 2 supported by the supporting substrate 64, and the supporting substrate 64 is removed after the interposer 2 is mounted on the circuit board 4.

According to the present embodiment, the semiconductor substrate, which is not easy for the through-holes to be formed in, is removed, and accordingly the through-holes for the through-electrodes to be buried in are not required to be formed in the semiconductor substrate. The semiconductor substrate 84 is removed with the interpose 2 supported by the supporting substrate 64, whereby even with the base 10 formed only of the resin layers 26, 34, 42, 52, 56, the interposer 2 is prevented from being deformed. Furthermore, according to the present embodiment, the interposer 2 is adhered by means of the heat foaming type double-sided tape 72, which facilitates removing the interposer 2 from the supporting substrate 64 when it is not necessary to support the interposer by the supporting substrate 64 any more. Thus, according to the present embodiment, the electronic device of high reliability can be easy fabricated at low costs.

Modified Embodiments

The present invention is not limited to the above-described embodiment and can cover other various modifications.

For example, in the above-described embodiment, the insulating barrier films 38, 40 are formed of aluminum oxide film. However, the barrier films 38, 40 are not essentially formed of aluminum oxide film and may be formed of the same material as the capacitor dielectric film 22, which is amorphous. When the capacitor dielectric film 22 is formed of BST film, the barrier films 38, 40 may be formed of amorphous BST film. The barrier films 38, 40 are formed of the same material as the capacitor dielectric film 22, which is amorphous, whereby good adhesion can be ensured, and because the thermal expansion coefficient of the barrier films 38, 40 and that of the capacitor dielectric film 22 match each other, no stress is applied to the thin-film capacitors 12, etc.

When the insulating barrier films 38, 40 are formed of amorphous BST film, the barrier films 38, 40 are of amorphous BST film are formed under conditions as exemplified below. The film forming method is, e.g., sputtering. The film thickness of the barrier films 38, 40 is, e.g., 100 nm. The flow rate ratio between Ar gas and $O_2$ gas to be fed into the chamber is, e.g., 8:1. The applied electric power is, e.g., 800 W. The film forming temperature is, e.g., the room temperature. When BST film is formed at the room temperature, the BST film can be formed an amorphous like material.

In the above-described embodiment, the resin layers 26, 34, 42, 52, 56 are formed of polyimide resin. However, the resin layers 26, 34, 42, 52, 56 are not formed essentially of polyimide resin. For example, the material of the resin layers 26, 34, 42, 52, 56 may be epoxy resin, benzocyclobutene (BCB), bismaleimide-triazine resin, polytetrafluoroethylene resin, acrylic resin or diallyl phthalate resin, or others.

When the resin layers 26, 34, 42, 52, 56 are formed of epoxy resin, the resin layers 26, 34, 42, 52, 56 are formed, e.g., under the following conditions. The film forming method is, e.g., the spin coating method. Conditions for the application are, e.g., 2000 rpm and 30 seconds. The applied thickness is, e.g., about 10 μm. The pre-bake temperature is, e.g., 60° C. The main bake temperature is, e.g., 300° C. The resin layers 26, 34, 42, 52, 56 formed under these conditions have an about 5 μm-thickness.

When the resin layers 42, 52, 56 are formed of BCB resin, the resin layers 42, 52, 56 of BCB resin are formed, e.g., under the following conditions. The film forming method is, e.g., the spin coating method. The conditions for the application are, e.g., 2000 rpm and 30 seconds. The applied thickness is, e.g., about 4.5 μm. The pre-bake temperature is, e.g., 70° C. The main bake temperature is, e.g., 260° C. The resin layers 42, 52, 56 formed under these conditions have, e.g., an about 5 μm-thickness.

In the above-described embodiment, the capacitor dielectric film 24 is formed of BST film. However, the capacitor dielectric film 24 is not essentially formed of BST film and may be formed of, e.g., $PbZr_xTi_{1-x}O_3$ (PZT) film. Conditions for forming the capacitor dielectric film of PZT are as exemplified below. The substrate temperature is, e.g., 200° C. The gas pressure inside the film forming chamber is, e.g., 0.5 Pa. The flow rate ratio between argon gas an oxygen gas is, e.g., 9:1. The applied electric power is, e.g., 120 W. The film forming period of time is, e.g., 60 minutes. The capacitor dielectric film 22 formed under these conditions have good electric characteristics of an about 100 nm-thickness and an about 200 dielectric constant.

The capacitor dielectric film 22 is not essentially formed of BST film and PZT film. For example, the dielectric film 22 may be formed of a composite oxide containing at least one element of Sr, Ba, Pb, Zr, Bi, Ta, Ti, Mg and Nb.

In the above-described embodiment, the lower electrodes 20 and the upper electrodes 24 are formed of Pt, etc. However, the lower electrodes 20 and the upper electrodes 24 are not essentially formed of Pt, etc. For example, the lower electrodes 20 and the upper electrodes 24 can be formed suitably of, e.g., Au, Cr, Cu, W, Pt, Pd, Ru, Ru oxide, Ir, Ir oxide, Pt oxide or others.

In the above-described embodiment, all the upper electrodes 24 of the plural thin-film capacitors 12 are connected to the same potential, and all the plural through-electrodes 14b are electrically connected to the interconnections 48. However, all the upper electrodes 24 are not electrically interconnected.

For example, when a plurality of electric power sources are supplied to the semiconductor integrated circuit device 6, the upper electrodes 24 are connected to different interconnections in accordance with the source voltages. Specifically, it is possible that some of the plural upper electrodes 24 are electrically interconnected by first interconnections, the plural through-electrodes connected to the first electric power source are connected to the first interconnections, the rest upper electrodes of the plural upper electrodes 24 are electrically interconnected by second interconnections, and the plural through-electrodes connected to the second electric power source are connected to the second interconnections. In this case, the test is made with the probe connected to any one of the through-electrodes 14b connected to the first interconnections, whereby the thin-film capacitors connected to the first interconnections can be tested at once. The test is made with any one of the through-electrodes 14b connected to the second interconnections, whereby the thin-film capacitors connected to the second interconnections can be tested at once. In this case as well, it is not necessary to connect the probe sequentially to the respectively through-electrodes 14b connected to the thin-film capacitors 12, which can simplify the test steps.

Even with one kind of electric power source to be supplied to the semiconductor integrated circuit device 6, it is not necessary to electrically connect all the upper electrodes 24 to the same interconnection 48. For example, it is possible that some of a plurality of upper electrodes 24 are electrically interconnected by the first interconnection, some of a plurality of through-electrodes 14b are connected to the first interconnection, the rest upper electrodes 24 of said plurality of upper electrodes 24 are electrically interconnected by the second interconnection, and the rest through-electrodes 14b of said plurality of said plurality of through electrodes 14b are connected to the second interconnection. In this case, the probe is connected to one of the through-electrodes 14b connected to the first interconnection to make the test, whereby the thin-film capacitors 12 connected to the first interconnection can be tested at once. The probe is connected to one of the through-electrodes 14b connected to the second interconnection to make the test, whereby the thin-film capacitors connected to the second interconnection can be tested at once. In this case as well, it is not necessary to connect the probe sequentially to the respective through-electrodes 14b connected to the thin-film capacitors 12, which can simplify the test steps.

When one electric power source is supplied to the semiconductor integrated circuit device 6, however, it is preferable that all the upper electrodes 24 are electrically interconnect by the interconnections 48, and all the through-electrodes 14b are electrically interconnected by the interconnections 48, which can drastically simplify the test steps.

What is claimed is:

1. An interposer comprising a base formed of a plurality of resin layers; a thin-film capacitor buried in the base, including a lower electrode, a capacitor dielectric film formed on the lower electrode, and an upper electrode formed on the capacitor dielectric film; a first through-electrode formed through the base and electrically connected to the upper electrode of the thin-film capacitor; and a second through-electrode formed through the base and electrically connected to the lower electrode of the thin-film capacitor, the interposer comprising:

a plurality of said thin-film capacitors formed over a first resin layer of said plurality of resin layers, and, a plurality of said first through-electrodes formed through the base, the interposer further comprising:

an interconnection formed over a second resin layer of said plurality of resin layers, the second resin layer being formed over said plurality of said thin-film capacitors, said plurality of said first through-electrodes and the upper electrodes of said plurality of said thin-film capacitors are electrically connected each other by the interconnection.

2. An interposer according to claim 1, wherein the lower electrodes of said plurality of said thin-film capacitors are formed integrally.

3. An interposer according to claim 1, further comprising third through-electrode formed through the base and insulated from the thin-film capacitor.

4. An interposer according to claim 1, further comprising an insulating barrier film covering an upper surface, an under surface and a side surface of the thin-film capacitor, for prohibiting the diffusion of hydrogen or water.

5. An interposer according to claim 4, wherein the insulating barrier film is formed of an inorganic material.

6. An interposer according to claim 4, wherein the insulating barrier film is a amorphous film formed of the same material as the capacitor dielectric film.

7. An interposer according to claim 4, wherein an opening is formed in the insulating barrier film down to the upper electrode,
a conductive barrier film is formed in the opening, for prohibiting the diffusion of hydrogen or water, and the interconnection is electrically connected to the upper electrode via the conductive barrier film.

8. An interposer according to claim 4, wherein an opening for exposing at least the side surface of the lower electrode is formed in the base and the insulating barrier film,
a conductive barrier film is formed in the opening, for prohibiting the diffusion of hydrogen or water,
the first through-electrode is buried in the opening with the conductive barrier film formed in, and
the first through-electrode is electrically connected to the lower electrode via the conductive barrier film.

9. An interposer according to claim 1, wherein the resin layer is formed of polyimide resin, epoxy resin, benzocyclobutene resin, bismaleimide-triazine resin, polytetrafluoroethylene resin, acrylic resin or diallyl phthalate resin.

10. An interposer according to claim 1, wherein the capacitor dielectric film is formed of a composite oxide containing at least one element of Sr, Ba, Pb, Zr, Bi, Ta, Ti, Mg and Nb.

11. An interposer according to claim 1, wherein the lower electrode or the upper electrode is formed of Au, Cr, Cu, W, Pt, Pd, Ru, Ru oxide, Ir, Ir oxide, Pt oxide.

* * * * *